United States Patent
Hsia et al.

(10) Patent No.: US 12,422,635 B2
(45) Date of Patent: Sep. 23, 2025

(54) THERMO-ELECTRIC COOLER FOR DISSIPATING HEAT OF OPTICAL ENGINE

(71) Applicant: Taiwan Semiconductor Manufacturing Co., Ltd., Hsinchu (TW)

(72) Inventors: Hsing-Kuo Hsia, Jhubei (TW); Chih-Kuang Yu, Chiayi (TW); Chen-Hua Yu, Hsinchu (TW); Jui Lin Chao, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 440 days.

(21) Appl. No.: 17/896,249

(22) Filed: Aug. 26, 2022

(65) Prior Publication Data

US 2023/0384543 A1    Nov. 30, 2023

Related U.S. Application Data

(60) Provisional application No. 63/346,543, filed on May 27, 2022.

(51) Int. Cl.
*G02B 6/42* (2006.01)
*H01L 23/38* (2006.01)

(52) U.S. Cl.
CPC ......... *G02B 6/4271* (2013.01); *G02B 6/4206* (2013.01); *G02B 6/4245* (2013.01); *H01L 23/38* (2013.01)

(58) Field of Classification Search
None
See application file for complete search history.

(56) References Cited

U.S. PATENT DOCUMENTS

| | | | |
|---|---|---|---|
| 11,916,023 B2 | 2/2024 | Huang et al. | |
| 2001/0036350 A1* | 11/2001 | Kashihara | G02B 6/4248 385/128 |
| 2014/0075960 A1 | 3/2014 | Kuo et al. | |
| 2016/0124164 A1* | 5/2016 | Doerr | G02B 6/428 385/14 |
| 2016/0377823 A1* | 12/2016 | Garland | G02B 6/4271 385/14 |
| 2017/0194308 A1 | 7/2017 | Evans et al. | |
| 2018/0226515 A1 | 8/2018 | Skeete | |
| 2019/0285804 A1 | 9/2019 | Ramachandran et al. | |
| 2020/0006088 A1* | 1/2020 | Yu | G02B 6/30 |
| 2021/0091056 A1 | 3/2021 | Yu et al. | |

FOREIGN PATENT DOCUMENTS

| | | |
|---|---|---|
| KR | 20020052512 A | 7/2002 |
| KR | 20180131320 A | 12/2018 |
| TW | 201414025 A | 4/2014 |

\* cited by examiner

*Primary Examiner* — Jerry Rahll
(74) *Attorney, Agent, or Firm* — Slater Matsil, LLP

(57) ABSTRACT

A method includes bonding a photonic engine onto an interposer, and bonding a package component onto the interposer. The package component includes a device die. The method further includes encapsulating the package component and the photonic engine in an encapsulant, attaching a thermal-electronic cooler to the photonic engine, and attaching a metal lid to the package component.

20 Claims, 33 Drawing Sheets

THERMO-ELECTRIC COOLER FOR DISSIPATING HEAT OF OPTICAL ENGINE

PRIORITY CLAIM AND CROSS-REFERENCE

This application claims the benefit of the following provisionally filed U.S. patent application: Application No. 63/346,543, filed on May 27, 2022, and entitled "TEC Integration for COUPE;" which application is hereby incorporated herein by reference.

BACKGROUND

As the bandwidth requirement grows rapidly for high-performance computing systems, high-speed optical Input-Output (I/O) modules have been used increasingly. The optical I/O modules are often connected to light sources (laser) as the circuit driving sources.

The conversion efficiency of laser from optical signals to electrical signals, however, is low, and more than 50 percent of the power may be dissipated as heat. This causes the temperature of the optical module that receives the laser to be high, and heat dissipation needs to be improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
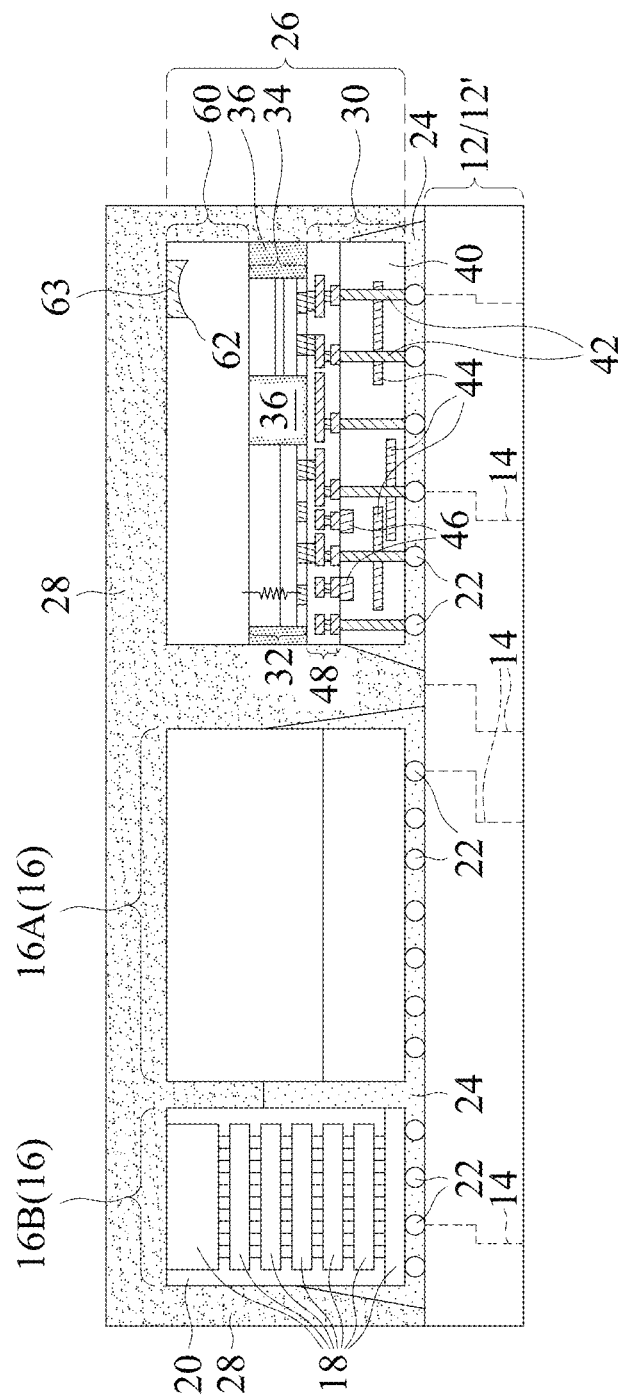
FIG. 1 through 6 illustrate the cross-sectional views of intermediate stages in the formation of a package including a Thermal-Electronic Cooler (TEC) for dissipating heat from a photonic engine, wherein bond wires are used for conducting current in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a photonic engine and a Thermal-Electronic Cooler (TEC) for cooling the photonic engine is formed. The processes for forming the package are provided. In accordance with some embodiments of the present disclosure, a TEC has its cold side attached to a photonic engine, and its hot side away from the photonic engine. A current is conducted through the TEC, so that heat can be conducted away from the photonic engine through the TEC. On the other hand, a metal lid may be used for conducting heat away from other package components such as memory stacks and logic dies in the package. With the using of the TEC, the heat dissipating efficiency is improved for the photonic engine. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 6 illustrate the cross-sectional views of intermediate stages in the formation of a package including TEC for cooling a photonic engine in accordance with some embodiments of the present disclosure. The corresponding processes are also reflected schematically in the process flow shown in FIG. 33.

Referring to FIG. 1, an initial structure of package 10 (FIG. 6) is formed. The initial structure may include package component 12. In accordance with some embodiments, package component 12 comprises a plurality of interposers 12', and is referred to as interposer wafer 12 hereinafter. Interposer wafer 12 is illustrated schematically, and the detailed structures are not shown in FIG. 1. Rather, the detailed structures of some example interposer wafer 12 are shown in FIGS. 26, 27, 31, and 32. Interposer wafer 12 includes electrical connections 14, which may electrically and signally interconnect the features on opposite sides of interposer wafer 12. The schematically illustrated connections 14 may represent Redistribution Lines (RDLs), through-vias, bond pads, metal pillars, and the like.

Figure 31:
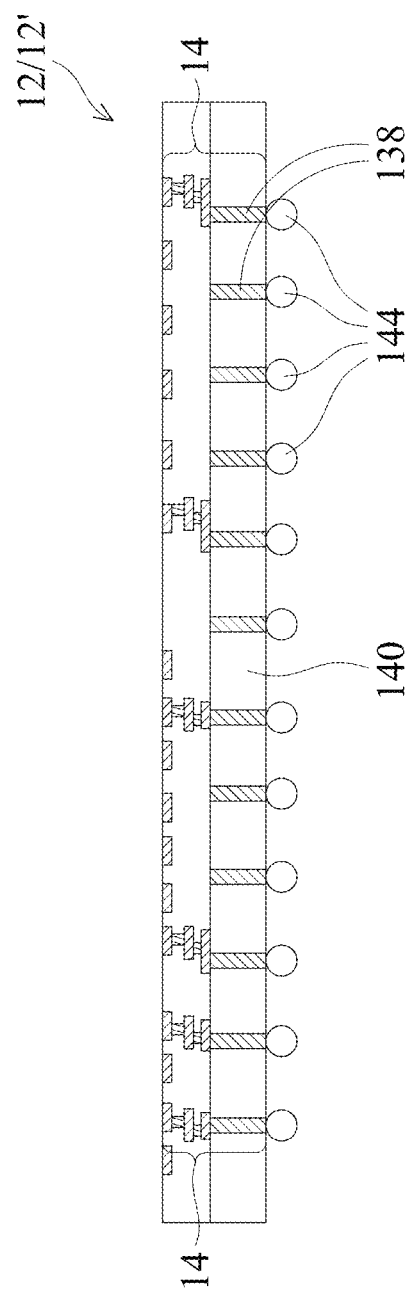
FIG. 31 illustrates a cross-sectional view of a silicon-based interposer in accordance with some embodiments.
Figure 32:
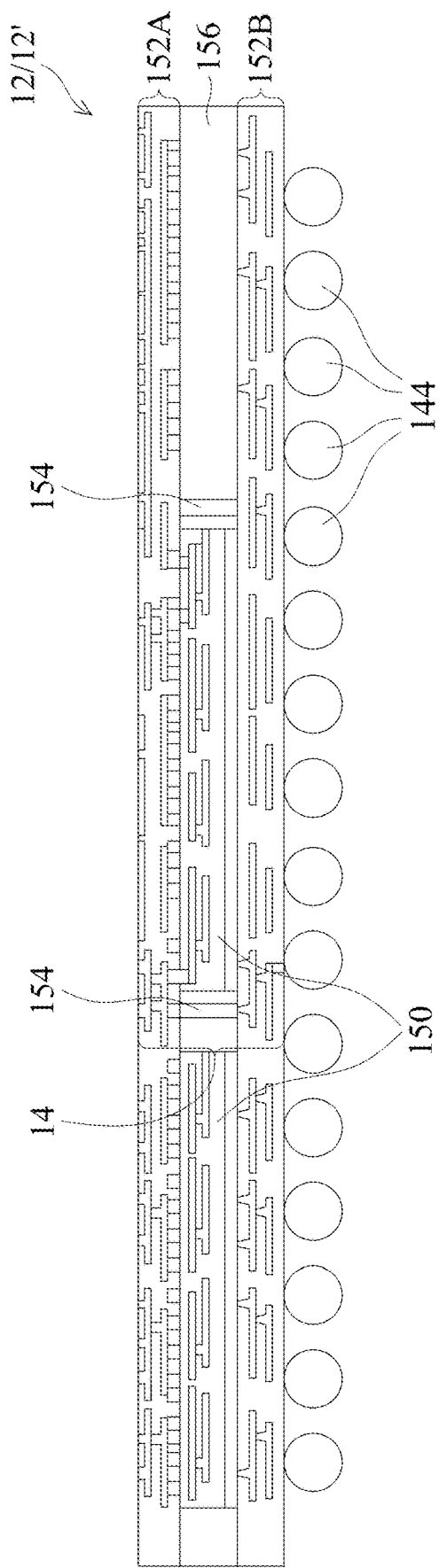
FIG. 32 illustrates a cross-sectional view of an interposer including built-in local interconnect dies in accordance with some embodiments

Interposer wafer 12 may be selected from any available structure including, and not limited to, a silicon-based interposer, an organic interposer (also referred to as an RDL interposer), a Local Silicon Interconnect (LSI) interposer including an LSI die(s) built therein, or the like. The silicon-based interposer may include a silicon substrate and through-silicon vias (TSVs, also referred to as through-vias (TVs)) penetrating through the silicon substrate, and an example silicon-based interposer is shown in FIG. 31. The organic interposer includes organic dielectric layers, and RDLs built in the dielectric layers layer-by-layer. The LSI interposer may include an LSI die(s), which include built-in routing metal lines connected to the LSI die. An example LSI die is illustrated in FIG. 32, as will be discussed subsequently.

Figure 33:
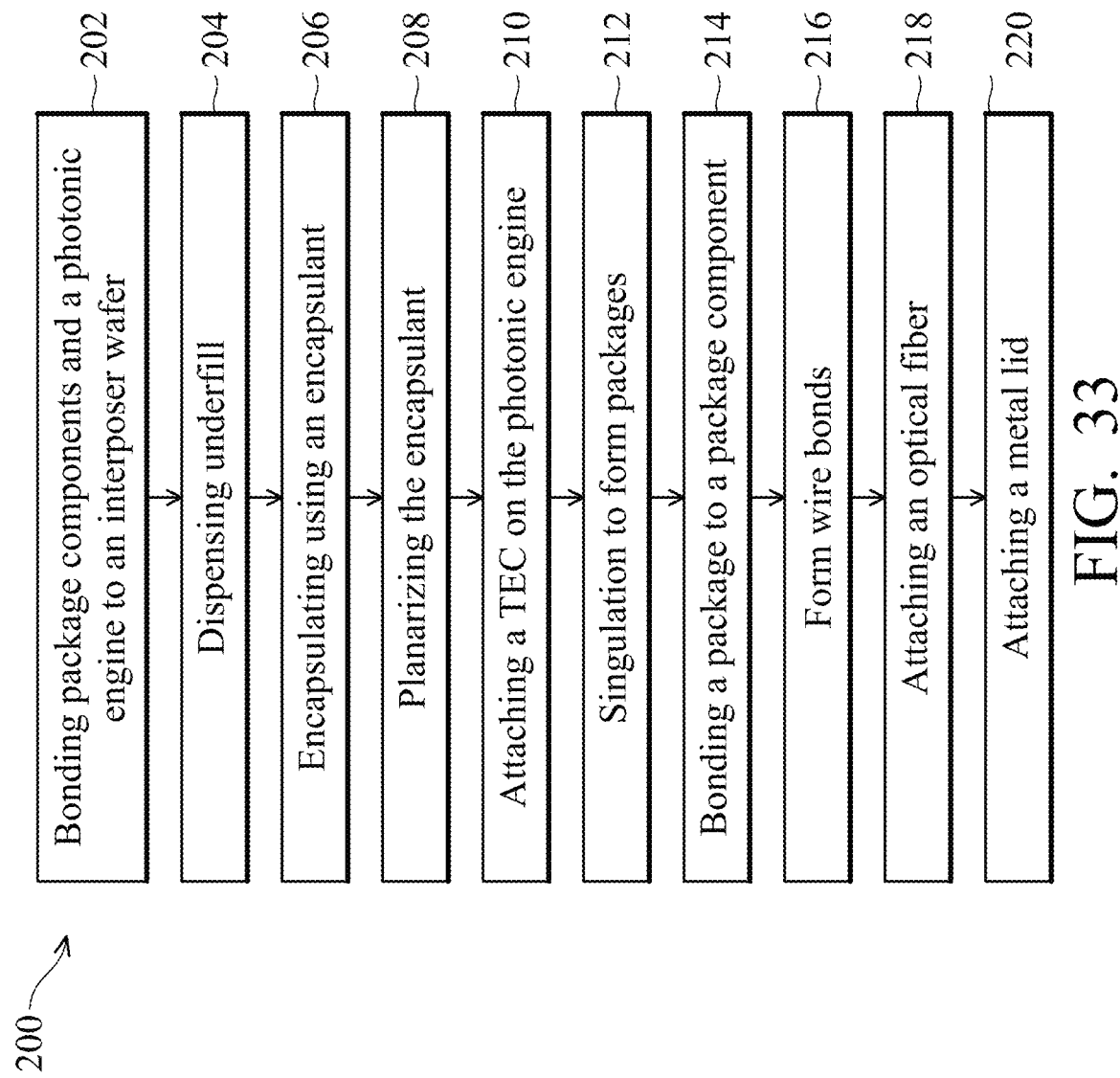
FIG. 33 illustrates a process flow for forming a package include a TEC for cooling a photonic engine in accordance with some embodiments.

Further referring to FIG. 1, in accordance with some embodiments, package components 16 (including package components 16A and 16B) are bonded to interposer wafer 12. The respective process is illustrated as process 202 in the process flow 200 as shown in FIG. 33. Each of package components 16 may be a device die, a package with a device die(s) packaged therein, a System-on-Chip (SoC) die including a plurality of integrated circuits (or device dies) integrated as a system, or the like. The device dies in package components 16 may be or may comprise logic dies, memory dies, input-output dies, Integrated Passive Devices (IPDs), or the like, or combinations thereof. For example, the logic device dies in package components 16 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 16 may include Static Random-Access Memory (SRAM) dies, Dynamic Random-Access Memory (DRAM) dies, or the like. The device dies in package components 16 may include semiconductor substrates and interconnect structures.

In the subsequent discussion in accordance with some example embodiments, package component 16A is a logic die, which may be an Application-Specific Integrated Circuit (ASIC) die. Package component 16B may be a memory stack such as a High-Performance Memory (HBM) stack. Package component 16B may include memory dies 18 forming a die stack, and an encapsulant 20 (such as a molding compound) encapsulating memory dies 18 therein.

Further referring back to FIG. 1, package components 16 may be bonded to the underlying interposer wafer 12, for example, through solder regions 22. In accordance with some embodiments, the bonding is through a Chip-on-Wafer (CoW) bonding process, wherein package components 16, which are discrete chips/packages, are bonded to the interposer wafer 12 that are in an unsawed wafer to form a reconstructed wafer.

Photonic engine 26 is also bonded to interposer wafer 12. The respective process is also illustrated as process 202 in the process flow 200 as shown in FIG. 33. Underfill 24 is dispensed into the gaps between package components 16, photonic engine 26, and interposer wafer 12. The respective process is illustrated as process 204 in the process flow 200 as shown in FIG. 33. After the dispensing of underfill 24, encapsulant 28, which may be molding compound, is applied to encapsulate package components 16 and photonic engine 26.

Photonic engine 26 may include photonic die 30, electronic die (E-die) 32, and photonic component 34. Electronic die 32 and photonic component 34 may be over and bonded to photonic die 30, and may be encapsulated in gap-filling region 36. In accordance with some embodiments, gap-filling region 36 is a dielectric region, and may include a silicon nitride layer, and an oxide layer over the silicon nitride layer.

In accordance with some embodiments, electronic die 32 includes the integrated circuits for interfacing with photonic die 30, such as the circuits for controlling the operation of photonic die 30. For example, electronic die 32 may include controllers, drivers, amplifiers, and/or the like, or combinations thereof, and may include Serializer/Deserializer (SerDes). The corresponding components in electronic die 32 may act as parts of I/O interfaces between optical signals and electrical signals.

Photonic die 30 may include substrate 40, which may be a dielectric substrate such as a silicon oxide substrate. Substrate 40 may also be a semiconductor substrate such as a silicon substrate. In accordance with some embodiments, photonic die 30 may include optical devices such as silicon waveguides, non-silicon waveguides, grating couplers, modulators, and/or the like. For example, modulators 46 (which may be germanium modulators) and silicon waveguides 44 are illustrated in accordance with some embodiments. Through-vias 42 are formed in substrate 40. Photonic die 30 may or may not include photo diodes and/or electrical devices such as controllers, drivers, amplifiers, and/or the like, and combinations thereof. Interconnect structure 48 may be formed over the optical devices, and may include a plurality of dielectric layers and metal lines and vias in the plurality of dielectric layers. Interconnect structure 48 is electrically connected to interposer wafer 12 through through-vias 42.

Supporting substrate 60 is formed over electronic die 32 and photonic component 34. Supporting substrate 60 may be bonded to gap-filling region 36 and the silicon substrate in electronic die 32 through fusion bond. For example, a silicon oxide layer (not shown) may be (or may not be) formed as a bottom surface layer of supporting substrate 60 for bonding to the underlying structures. In accordance with some embodiments, supporting substrate 60 is formed of a homogeneous material having a high thermal conductivity. For example, supporting substrate 60 may be formed of or comprise silicon or other transparent and thermally conductive materials. Alternatively, supporting substrate 60 may be formed of a metal such as copper, tungsten, or the like. When comprising silicon, supporting substrate 60 may not have any metallic feature formed therein. A part of the top surface of supporting substrate 60 may be curved to form micro lens 62. In accordance with some embodiments, micro lens 62 is recessed from the top surface of supporting substrate 60. In accordance with alternative embodiments, micro lens 62 protrudes out of the supporting substrate 60. When recessed, micro lens 62 may be filled with a filling material 63 such as a polymer as a protection layer. In accordance with alternative embodiments, the recess of micro lens 62 is not filled.

In accordance with some embodiments, photonic component 34 is or comprises a photo diode (such as a laser diode), which may be formed of or comprise a III-V semiconductor material. In accordance with some embodiments, photonic component 34 is configured to receive an electrical signal, and emit a light beam (such as laser beam) to micro lens 62. In accordance with alternative embodiments, photonic component 34 is configured to receive a light beam from micro lens 62, and convert the light to electrical signal. The electrical signal in photonic component 34 may be transmitted to, or received from, photonic die 30.

In accordance with some embodiments, at the time package components 16 and photonic engine 26 are bonded to interposer wafer 12, interposer wafer 12 already includes electrical connections 14 connecting the features on the top side to the bottom side of interposer wafer 12. In accordance with alternative embodiments in which interposer wafer 12 comprises a silicon substrate, the interposer wafer 12 in FIG. 1 may have the structure shown in FIG. 26. The corresponding interposer wafer 12 may have through-vias 138 extending into, but not penetrating through, silicon substrate 140. The processes as shown in FIG. 27 is then preformed to complete the formation of interposer wafer 12, wherein through-vias 138 and RDLs in combination form electrical connections 14 as shown in FIG. 1.

Figure 2:
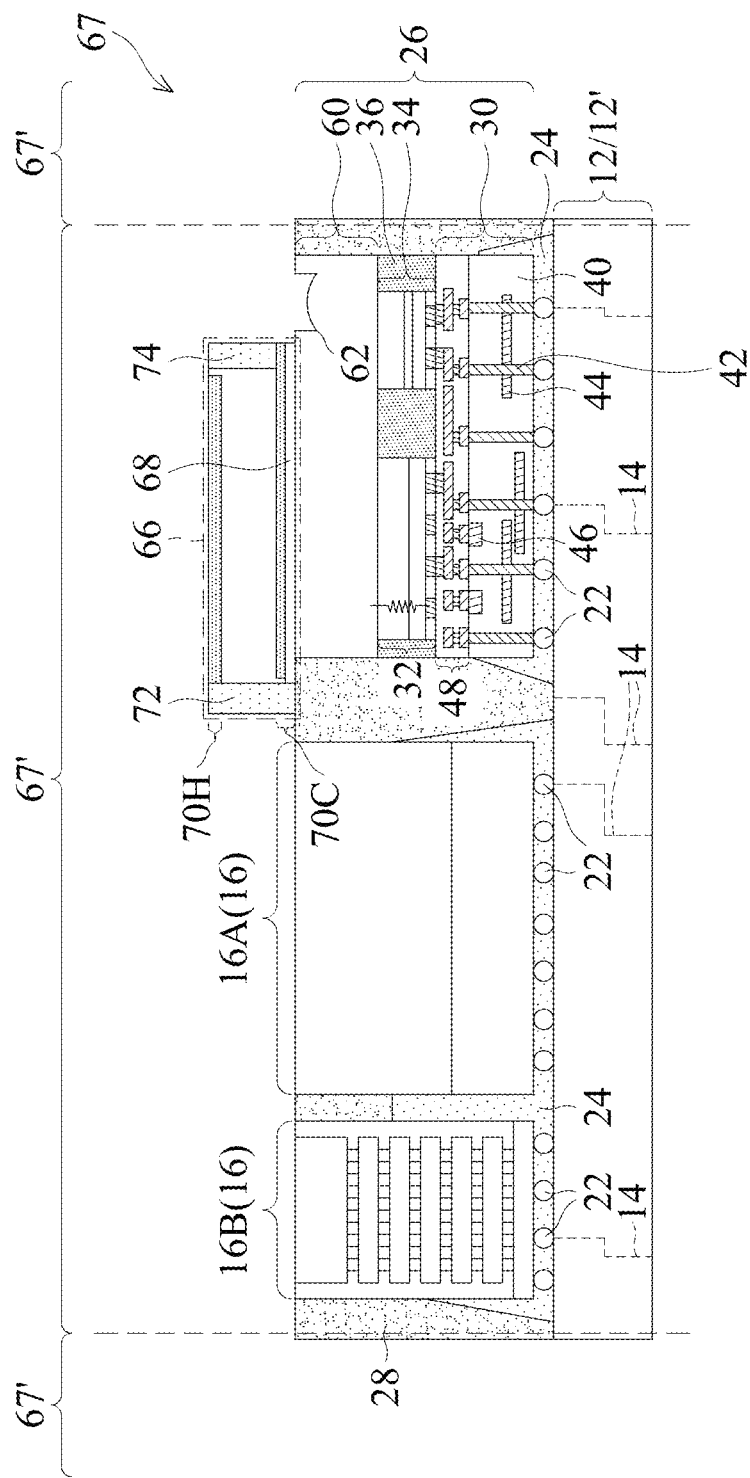

Referring again to FIG. 1, encapsulant 28, which may be a molding compound, a molding underfill, an epoxy, a resin, or the like, is applied to encapsulate package components 16 and photonic engine 26. The respective process is illustrated as process 206 in the process flow 200 as shown in FIG. 33. The recess of micro lens 62 may be filed with encapsulant 28 if protection layer 63 is not formed. Next, a planarization process is performed on encapsulant 28 to level its top surface with the top surfaces of package components 16 and supporting substrate 60. The respective process is illustrated as process 208 in the process flow 200 as shown in FIG. 33. Protection layer 63, or the portion of encapsulant 28 filling the recess of micro lens 62, is then removed. The resulting structure is shown in FIG. 2. Reconstructed wafer 67 is thus formed.

Further referring to FIG. 2, TEC 66 is attached to supporting substrate 60 in order to advance the formation of reconstructed wafer 67. The respective process is illustrated as process 210 in the process flow 200 as shown in FIG. 33. In accordance with some embodiments, the attachment is performed through Thermal Interface Material (TIM) 68, so that heat may be transferred from supporting substrate 60 to TEC through TIM 68. TEC 66 is illustrated schematically, and the detailed structure of TEC 66 is not shown in FIG. 2. Rather, the detailed structures of some example TECs 66 are shown in FIGS. 28A, 28B, 29, and 30.

TEC 66 uses Peltier effect to create a heat flux at the junction of two different types of materials. A TEC is a solid-state active heat pump that transfers heat from one side of the device to the other. The transferring of the heat consumes electrical energy in the form of current, and the direction of the heat-transfer depends on the direction of the current. In accordance with some embodiments of the present disclosure, TEC 66 is used for the cooling of the underlying photonic engine 26.

In accordance with some embodiments, as shown schematically in FIG. 2, TEC 66 includes cold side 70C, hot side 70H, current input node 72, and current output node 74. The cold side 70C is on the side closer to photonic engine 26, while the hot side 70H is on the side away from photonic engine 26. During the operation of TEC 66, heat is conducted from cold side 70C to hot side 70H, which is hotter than cold side 70C. The hot side 70H may be (or may not be) further attached to a heat sink (not shown) to conduct heat away. Accordingly, since the cold side 70C is at a lower temperature than if no TEC 66 is attached, the heat dissipation efficiency from photonic engine 26 to TEC 66 is improved.

FIGS. 28A, 28B, 29, and 30 illustrate some example TECs 66 in accordance with some embodiments. It is appreciated that the TECs 66 adopted in the embodiments may have more variations different from illustrated, which variations are also included in the present disclosure.

Figure 28A:
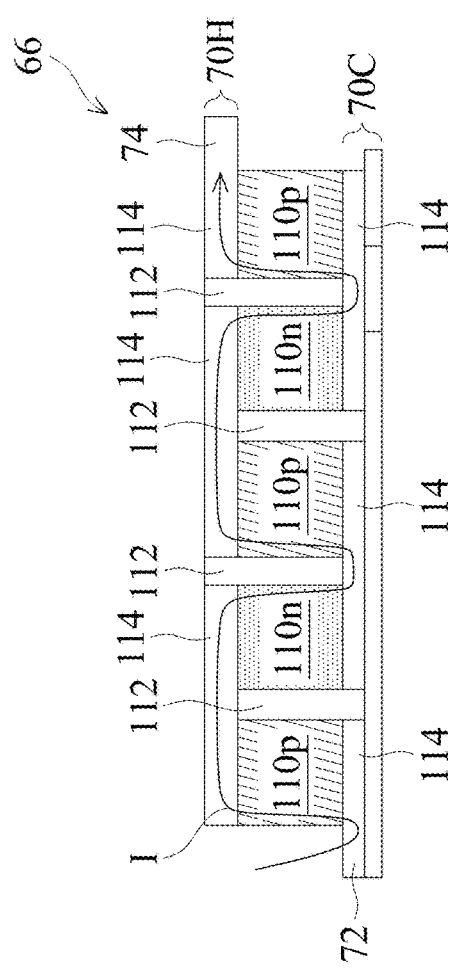
FIGS. 28A and 28B illustrate a cross-sectional view and a perspective view, respectively, of a BiTe-based TEC in accordance with some embodiments.
Figure 28B:
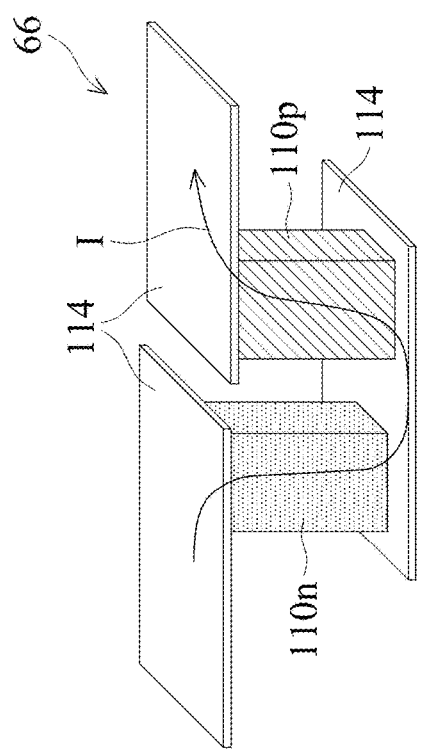

FIGS. 28A and 28B illustrate a cross-sectional view and a perspective view, respectively, of a part of a BiTe-based TEC 66 in accordance with some embodiments. BiTe-based TEC 66 includes a plurality of p-type doped BiTe alloy blocks 110$p$ and a plurality of n-type doped BiTe alloy blocks 110$n$, which are allocated alternatingly. The neighboring BiTe alloy blocks 110$p$ and 110$n$ are electrically insulated from each other by insulating layers 112, which may be ceramic layers in accordance with some embodiments. The BiTe alloy may comprise $Bi_2Te_3$, which may be formed by sealing mixed powder of bismuth and tellurium metal in a quartz tube is under vacuum, and heating the BiTe alloy to a high temperature such as 800° C. in a furnace. A plurality of metal plates 114 electrically interconnect neighboring BiTe alloy blocks 110$p$ and 110$n$, so that the p-type doped BiTe alloy blocks 110$p$ and the n-type doped BiTe alloy blocks 110$n$ are serially connected. When a current I is input into current input node 72, and output from current output node 74, the current I flows through the serially connected p-type doped BiTe alloy blocks 110$p$ and the n-type doped BiTe alloy blocks 110$n$. Due to the Peltier effect, heat is transferred from the bottom side to the top side of TEC 66. Accordingly, the bottom side acts as the cold side 70C, and the top side acts as the hot side 70H.

Figure 29:
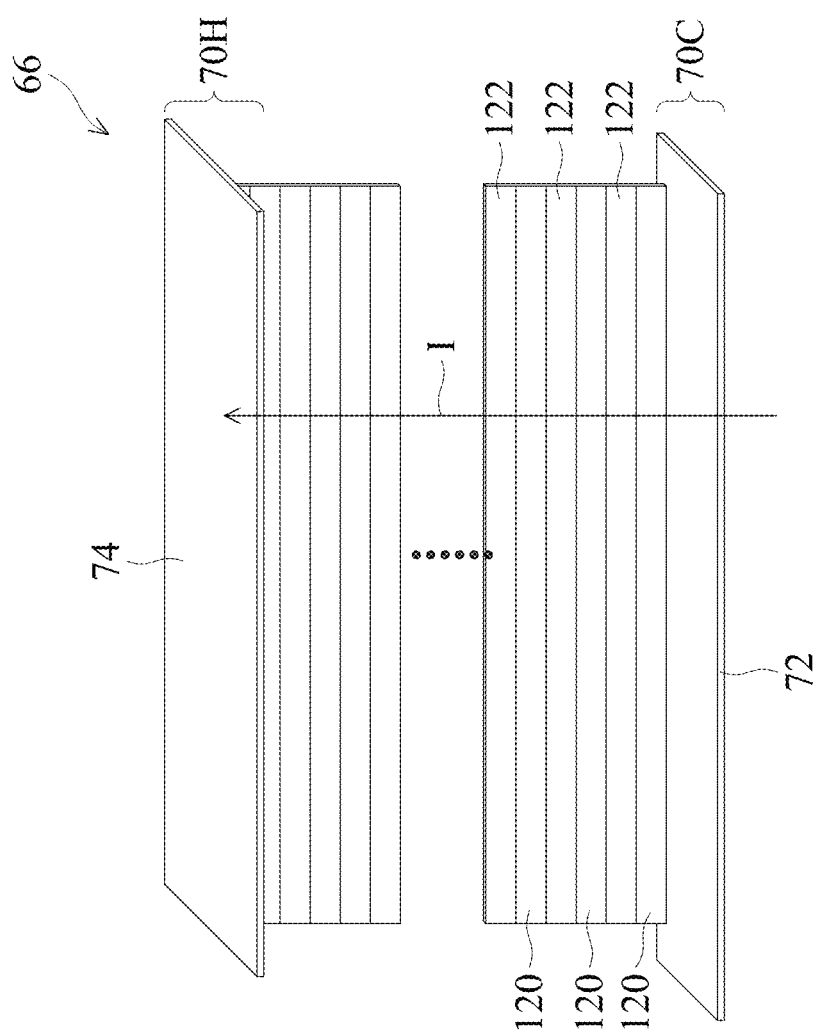
FIG. 29 illustrates a perspective view of a vertical Si/SiGe-based TEC in accordance with some embodiments.

FIG. 29 illustrates a perspective view of a vertical Si/SiGe based TEC 66 in accordance with some embodiments. The vertical Si/SiGe based TEC 66 has a Si/SiGe multilayer superlattice structure including a plurality of Si layers 120 and a plurality of SiGe layers 122 stacked and allocated alternatingly. Si layers 120 and SiGe layers 122 may be deposited, for example, through Metal-Organic Chemical Vapor Deposition (MOCVD) or other applicable methods. The superlattice structure obstructs phonon transfer (with reduced thermal conductivity) and increases electron/hole transfer (with increased electric conductivity). Accordingly, Seebeck Coefficient is improved, and heat is transferred. When a current I is input into current input node 72, and output from current output node 74, current I flows from the bottom side to the top side, and the bottom side becomes the cold side 70C, while the top side becomes the hot side 70H.

Figure 30:
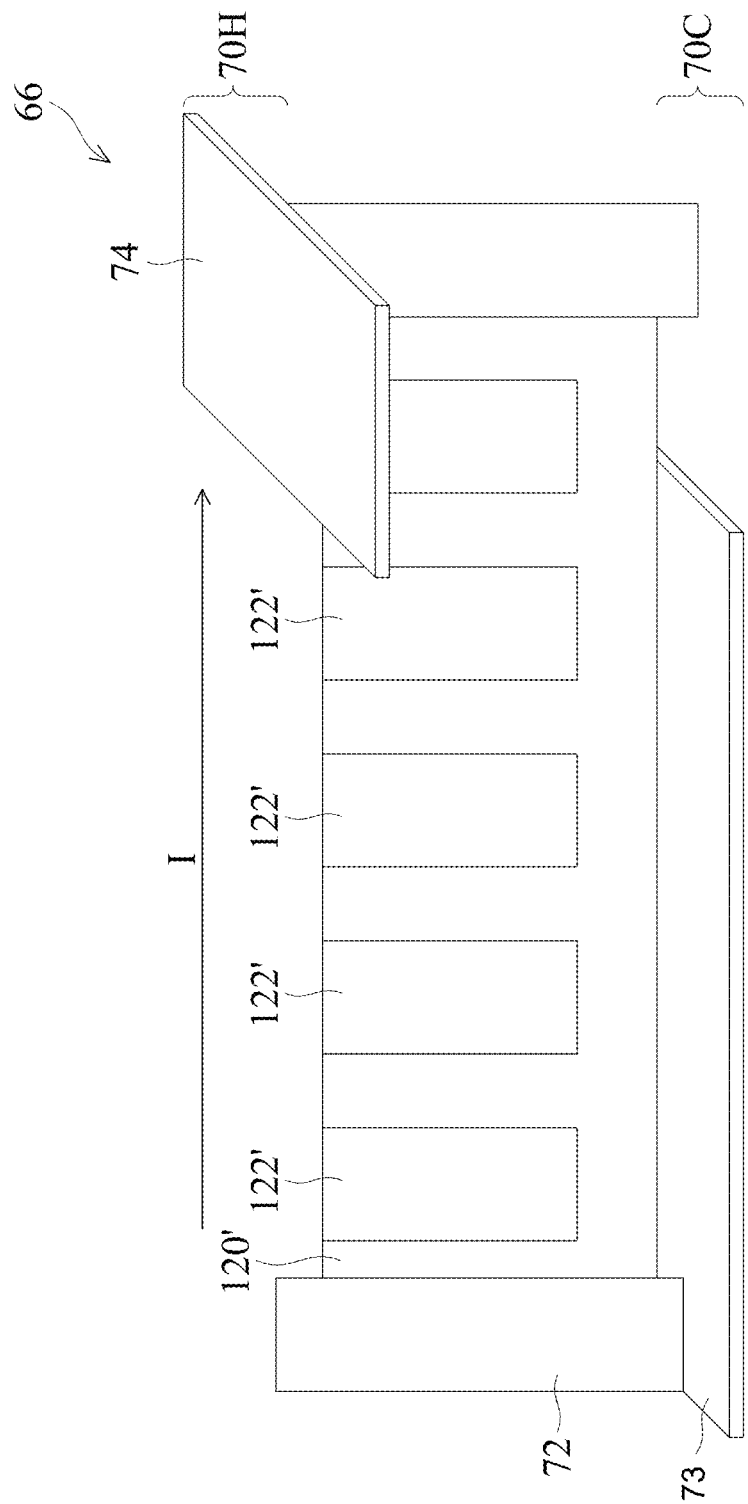
FIG. 30 illustrates a perspective view of a horizontal Si/SiGe-based TEC in accordance with some embodiments.

FIG. 30 illustrates a perspective view of a horizontal Si/SiGe based TEC 66 in accordance with some embodiments. The horizontal Si/SiGe based TEC 66 includes a plurality of SiGe layers 122' embedded in Si region 120'. A current I may be applied to current input node 72 and output out of current output node 74. When current I flow from the left side to the right side, the left side becomes the cold side 70C, while the right side becomes the hot side 70H. A thermally conductive plate (also denoted as 73) is placed underlying SiGe region 122' and joined to current input node 72, so that the bottom side becomes the cold side 70C. The metal plate of the current output node 74, which is on the top side of TEC, becomes the hot side 70H.

Referring back to FIG. 2, after TEC 66 is attached to photonic engine 26, reconstructed wafer 67 may be singulated to form a plurality of identical packages 67', each including one TEC 66 and a photonic engine 26, an interposer 12' in interposer wafer 12, and some other components. The respective process is illustrated as process 212 in the process flow 200 as shown in FIG. 33.

Figure 3:
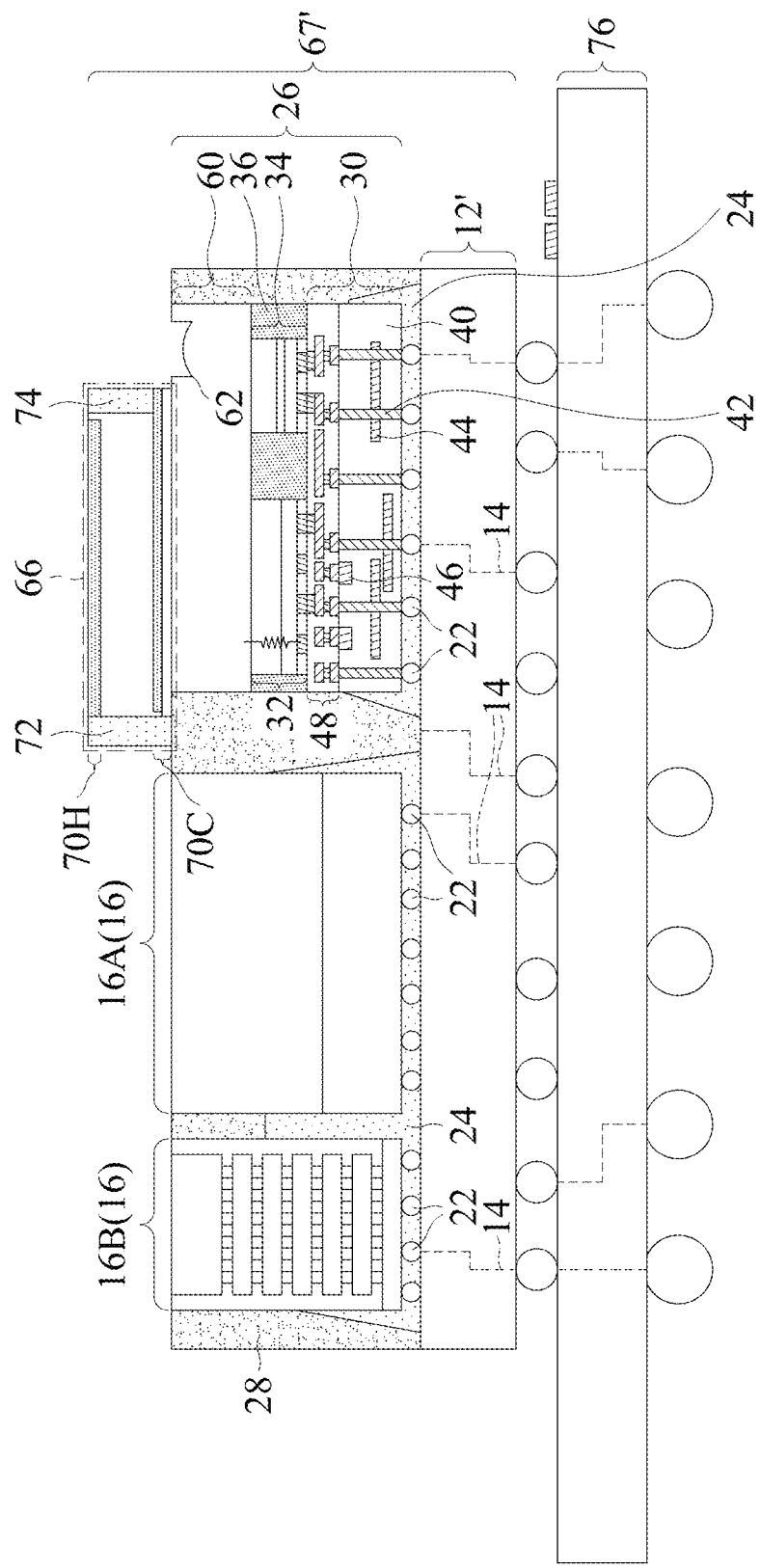

Next, as shown in FIG. 3, package 67' is bonded to package component 76. The respective process is illustrated as process 214 in the process flow 200 as shown in FIG. 33. In accordance with some embodiments, package component 76 is or comprises a package substrate, which may be a cored-substrate including a core, or a coreless substrate. The resulting package is thus a Chip-on-Wafer-on-Substrate (CoWoS) substrate. In accordance with other embodiments, package component 76 may be a printed circuit board, a package, or the like.

Figure 4:
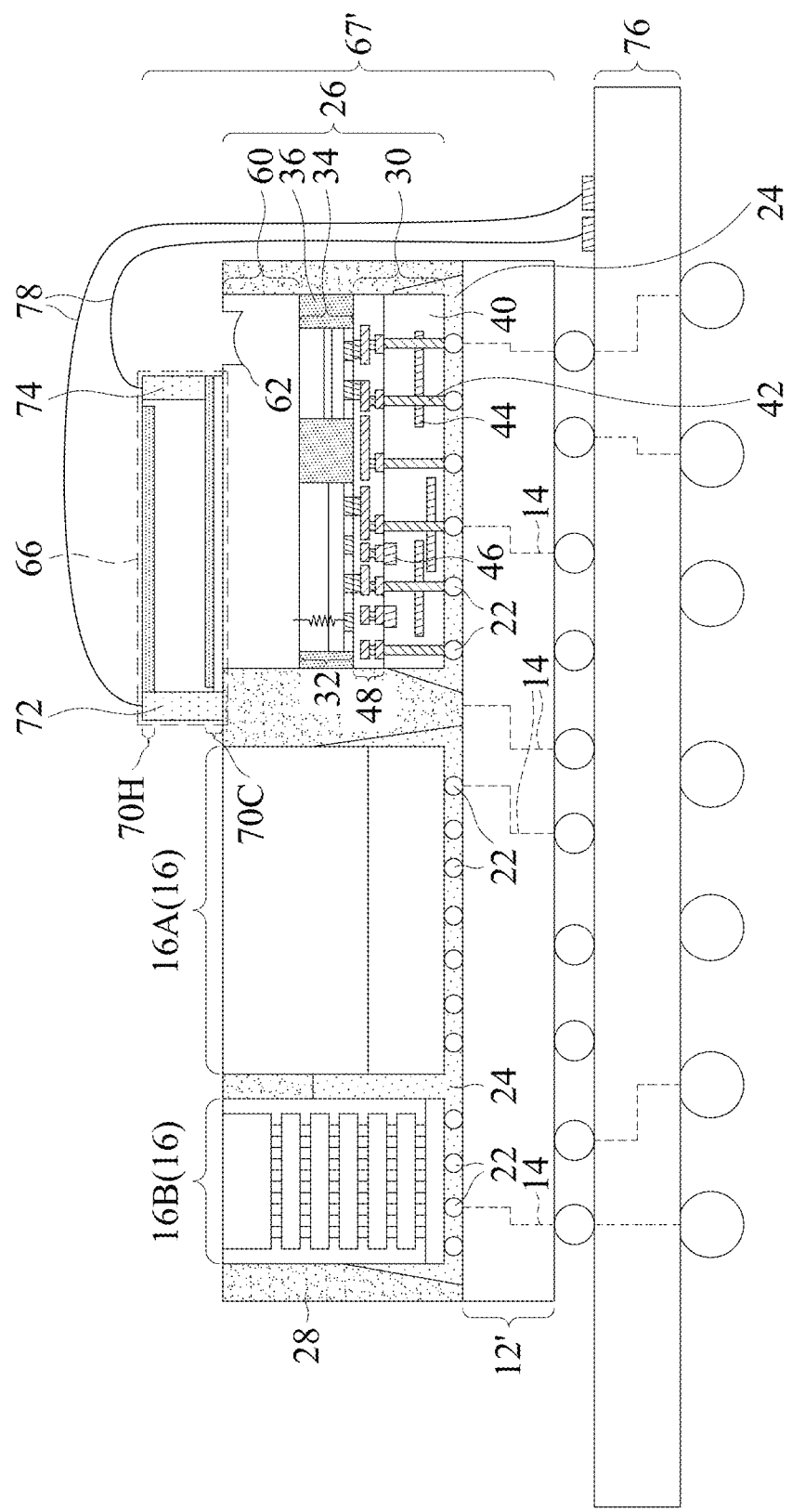

Referring to FIG. 4, electrical connections 78, which may be bond wires, are made to connect to TEC 66, so that a current can be fed to TEC 66 in order to perform the cooling function. In accordance with some embodiments, bond wires 78 are attached through wire bonding, and are bonded to the current input node 72 and current output node 74. Bond wires 78 may be connected to package component 76 in accordance with some embodiments. The respective process is illustrated as process 216 in the process flow 200 as shown in FIG. 33.

Figure 5:
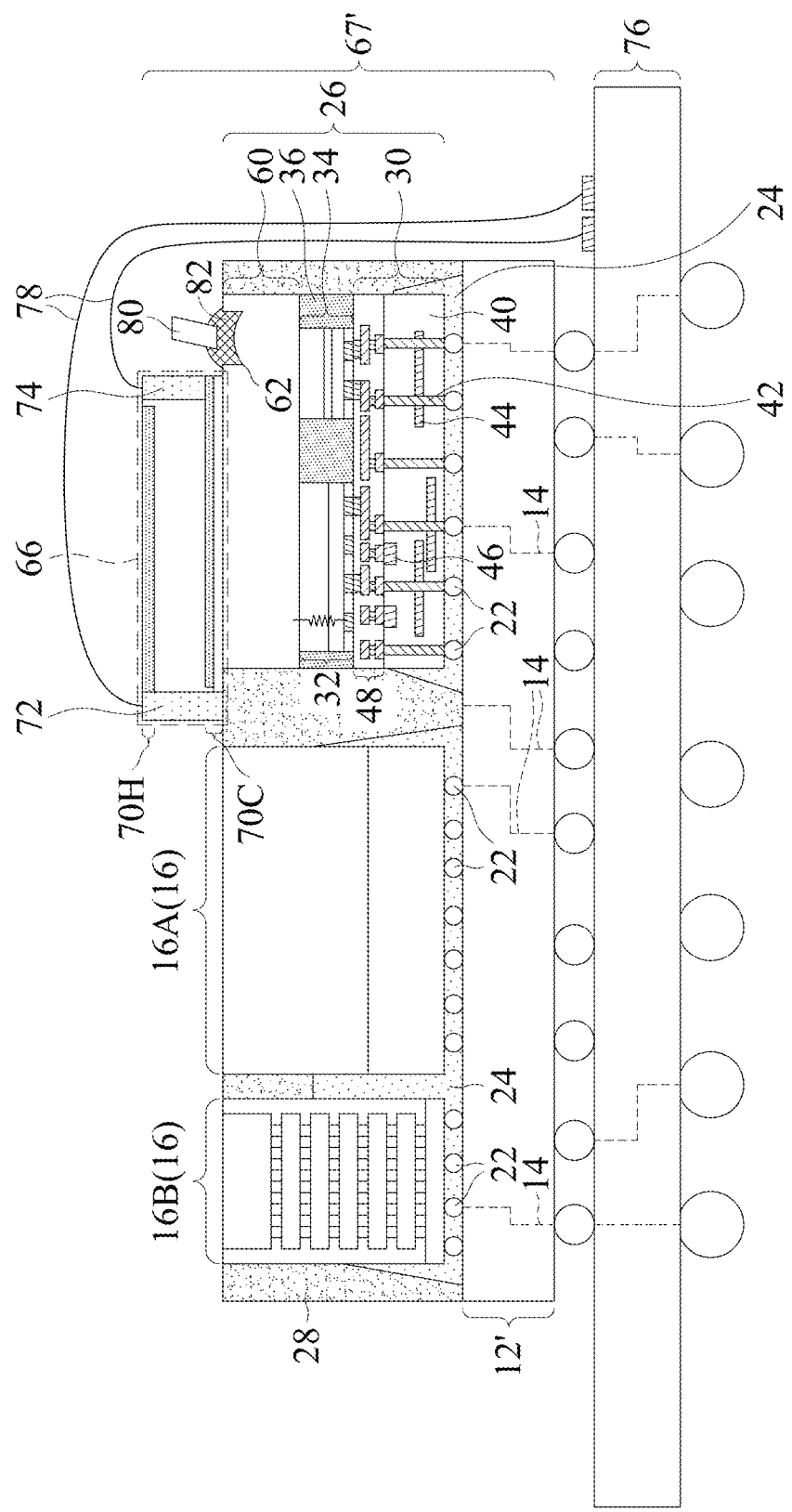

Referring to FIG. 5, optical fiber 80 is attached to photonic engine 26, and is aligned to micro lens 62. The attachment may be performed using optical glue 82, which fills the recess of micro lens 62. The respective process is illustrated as process 218 in the process flow 200 as shown in FIG. 33.

Figure 6:
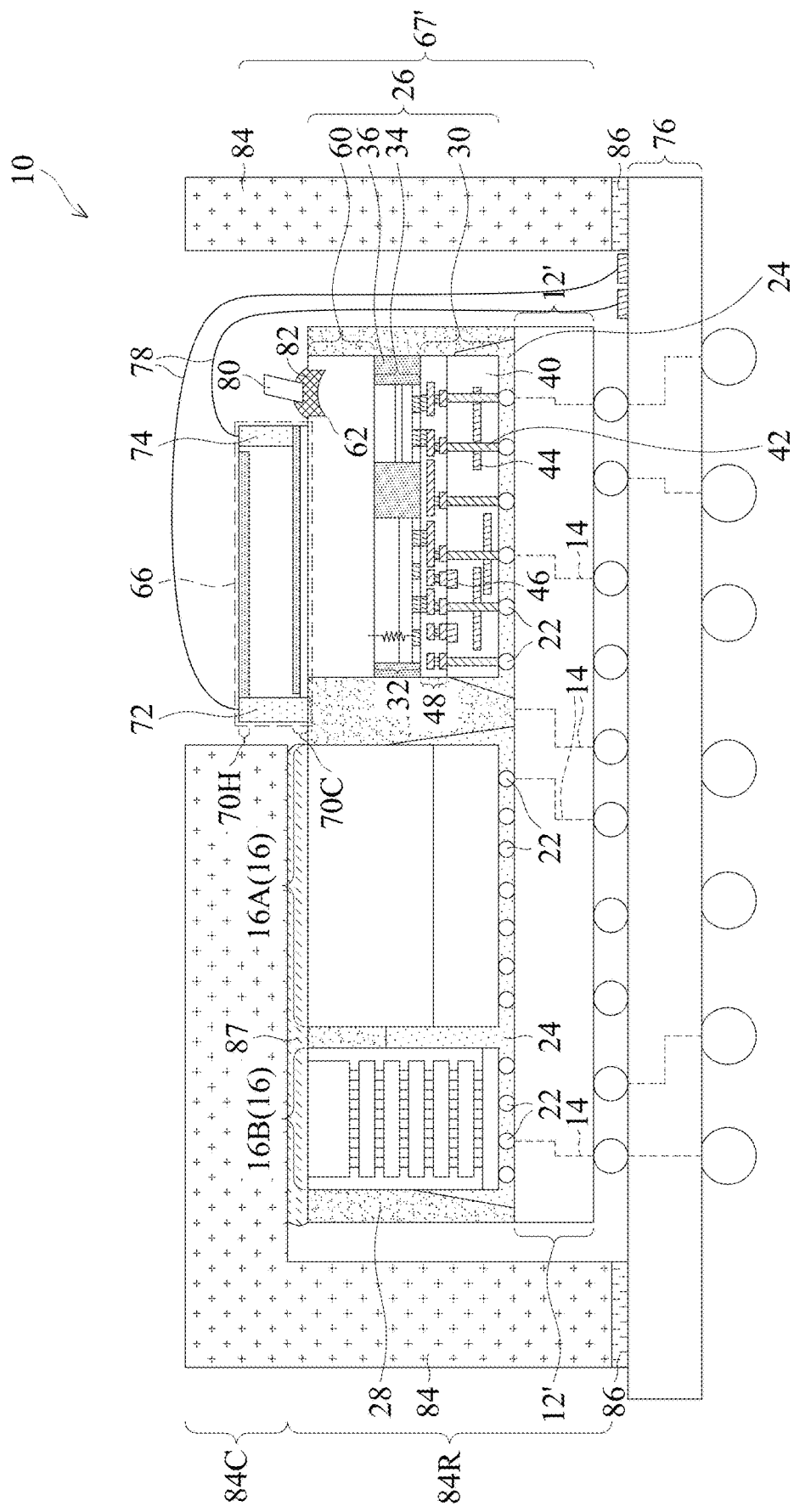

FIG. 6 illustrates the attachment of metal lid 84, which is attached to package component 76 through adhesive 86. The respective process is illustrated as process 220 in the process flow 200 as shown in FIG. 33. TIM 87 is dispensed on the top of package components 16, and joins metal lid 84 to package components 16. Package 10 is thus formed. Metal lid 84 includes a left portion on the left side of package 67', and a right portion on the right side of package 67'. The illustrated left side and the right side may be portions of a metal ring portion 84R of metal lid 84, wherein metal ring portion 84R may form a full ring. When viewed from top, metal lid 84 includes a cover portion 84C, with an opening formed in the cover portion 84C to allow the ventilation and the cooling, and for optical fiber 80 to go through.

In accordance with some embodiments of the present disclosure, as shown in FIG. 6, Photonic engine 26 is cooled using TEC 66. Photonic engine 26 may receive and operate laser, which, when converted to and form electrical signals, has a low conversion efficiency, sometimes lower than about 50 percent. This results in a significant amount of energy being converted to heat in photonic engine 26. Accordingly, to maintain the temperature of photonic engine 26 to be low and in its suitable range, TEC 66 is used, which is more efficient in dissipating heat due to the temperature difference between its cool side and hot side than a typical heat sink or metal lid.

On the other hand, TEC 66 is operated by conducting a current, and consumes power. Accordingly, package components 16 such as non-photonic logic dies and memory dies, which generate less heat than photonic engine 26, may be cooled using metal lid, so that less power is used.

FIGS. 7 through 18 illustrate the cross-sectional views of intermediate stages in the formation of a package in accordance with alternative embodiments of the present disclosure. These embodiments are similar to the embodiments shown in FIGS. 1 through 6, except that instead of forming wire bonds to provide current to TEC 66, through-dielectric vias and through-silicon vias (alternatively referred to as through-vias) are formed to penetrate through gap-filling region 36 and supporting substrate 60. The current for operating TEC 66 is thus provided through supporting substrate 60. Unless specified otherwise, the materials, the structures, and the formation processes of the components in these embodiments (and the embodiments shown in FIGS. 19 through 25) are essentially the same as the like components denoted by like reference numerals in the preceding embodiments shown in FIGS. 1 through 6. The details regarding the materials, the structures, and the formation processes of the components shown in FIGS. 7 through 18 (and the embodiments shown in FIGS. 19 through 25 in accordance with yet alternative embodiments) may thus be found in the discussion of the preceding embodiments.

Figure 7:
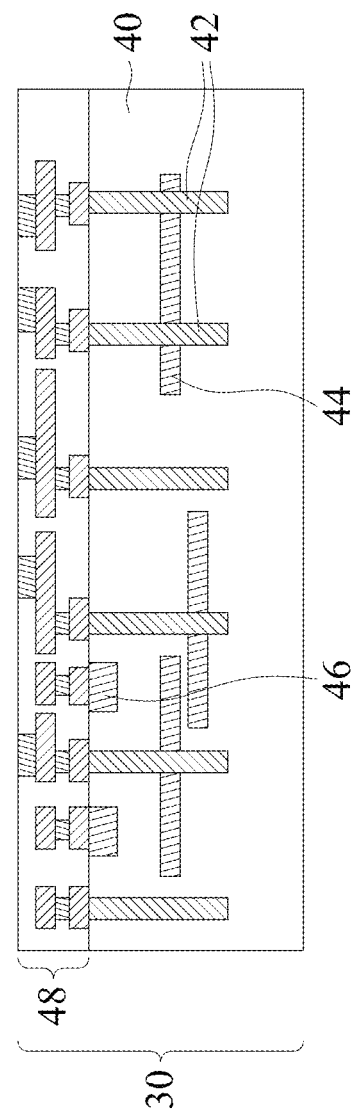
FIG. 7 through 18 illustrate the cross-sectional views of the intermediate stages in the formation of a package including a TEC for dissipating heat from a photonic engine, wherein through-silicon vias are used for conducting current in accordance with some embodiments.

FIGS. 7 through 12 illustrate the formation of a photonic engine 26 including through-vias in a supporting substrate in accordance with some embodiments. Referring to FIG. 7, photonic die 30 is formed. In accordance with some embodiments, photonic die 30 includes substrate 40, through-vias 42, waveguides 44, Ge modulator 46, and interconnect structure 48. In accordance with some embodiments, photonic die 30 is in a wafer including a plurality of photonic dies identical to photonic die 30.

Figure 8:
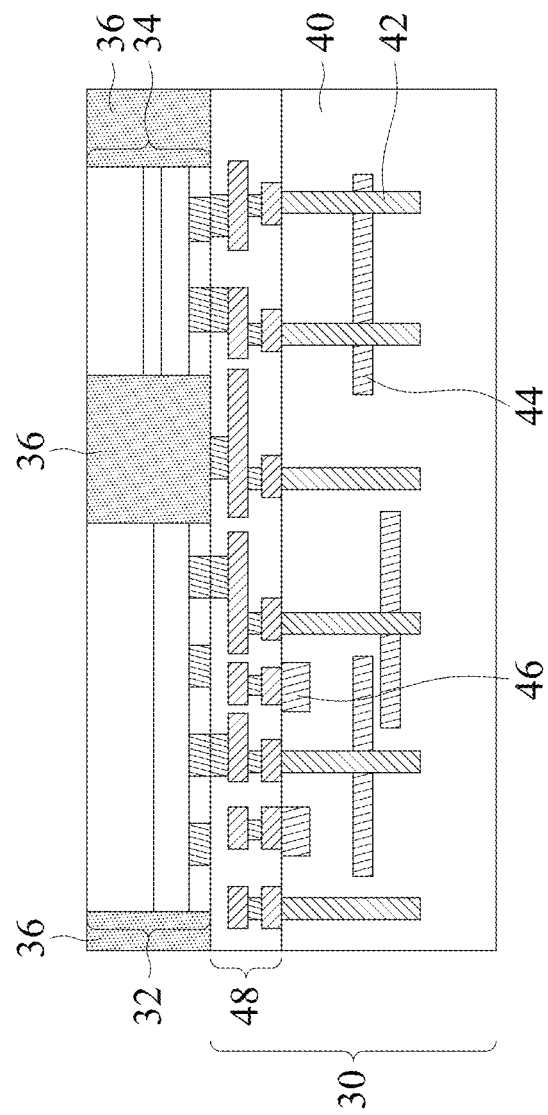

Next, referring to FIG. 8, electronic die 32 and photonic component 34 are bonded to photonic die 30. Gap-filling region 36 is then formed to fill the gaps between electronic die 32 and photonic component 34.

Figure 9:
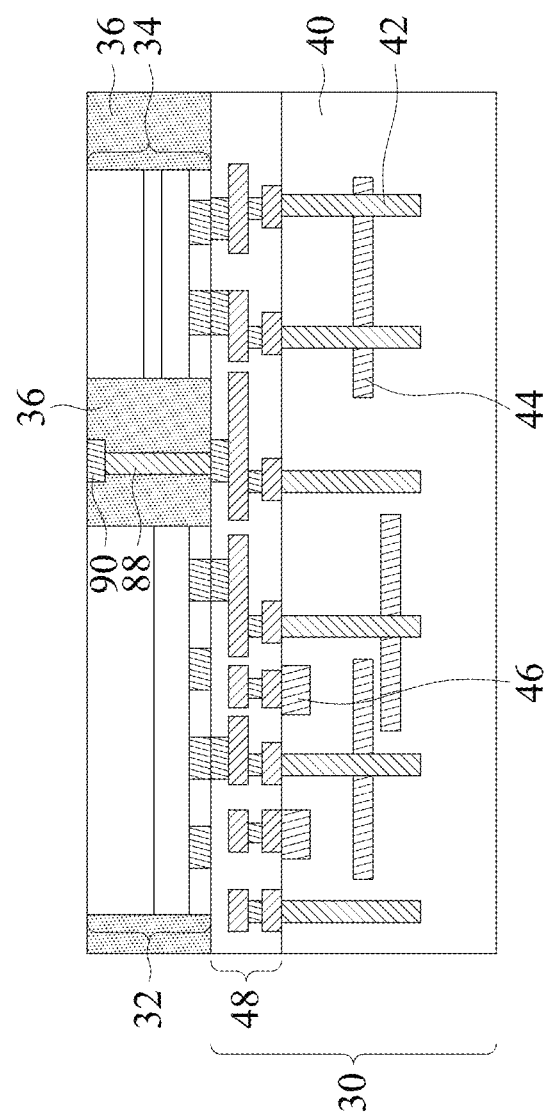

In a subsequent process, as shown in FIG. 9, through-vias 88 and bond pads 90 are formed in gap-filling region 36. Although one through-via 88 is illustrated, there may be two through-vias 88 formed over each photonic die 30, with the other through-via 88 in another plane that is not shown. The formation process may include etching gap-filling region 36 to form openings, and filling the openings with conductive materials, followed by a planarization process. In accordance with some embodiments, through-vias 88 and bond pads 90 may be formed of or comprises Ti, TiN, Ta, TaN, tungsten, copper, alloys thereof, and multi-layers thereof. Through-vias 88 and bond pads 90 are electrically connected to metal pads in interconnect structure 48. In accordance with alternative embodiments, bond pads 90 are not formed, and through-vias 88 extend to the top surface of gap-filling region 36.

In accordance with alternative embodiments, instead of pre-forming through-vias 42 before the formation of interconnect structure 48, the through-vias 88 and through-vias 42 are formed as integrated through-vias that continuously extend through gap-filling region 36, the dielectric layers in interconnect structure 48, and extend into substrate 40. The corresponding through-vias will also have straight edges extending all the way from the top surface of gap-filling region 36 into substrate 40.

Figure 10:
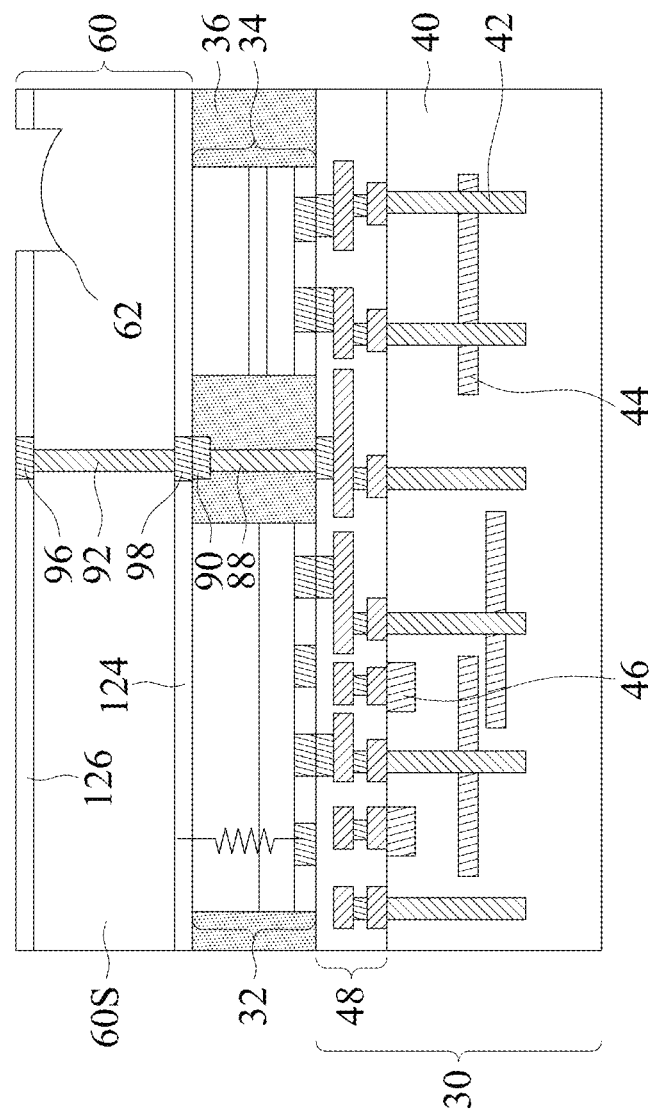

Referring to FIG. 10, supporting substrate 60 is bonded to the underlying structure, for example, through hybrid bonding. In accordance with some embodiments, supporting substrate 60 is preformed, and includes substrate 60S, which may be a silicon substrate, or may be formed of other thermally conductive materials. Furthermore, bond layer 124 and bond pads 98 are formed at the bottom side. Bond layer 124 is bonded to gap-fill region 36 and the silicon substrate in electronic die 32 through fusion bonding, with Si—O—Si bonds being formed, for example. Bond pads 98 are bonded to bond pads 90. Bond pads 96 and the corresponding dielectric layer 126 may be formed on the top side of supporting substrate 60. Each of through-vias 92 may include an inner conductive portion and an outer insulation layer, wherein the outer insulation layer electrically insulates the inner conductive portion from substrate 60S. Bond pads 96 and 98 are also electrically insulated from substrate 60S, for example, by the insulation layers.

Figure 11:
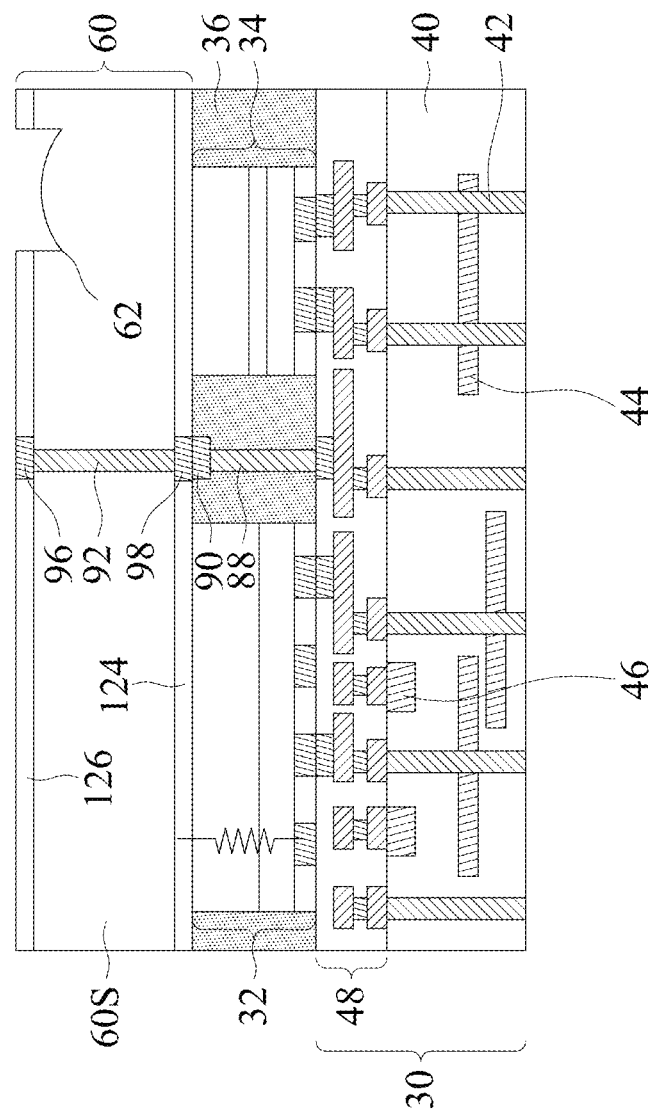
Figure 12:
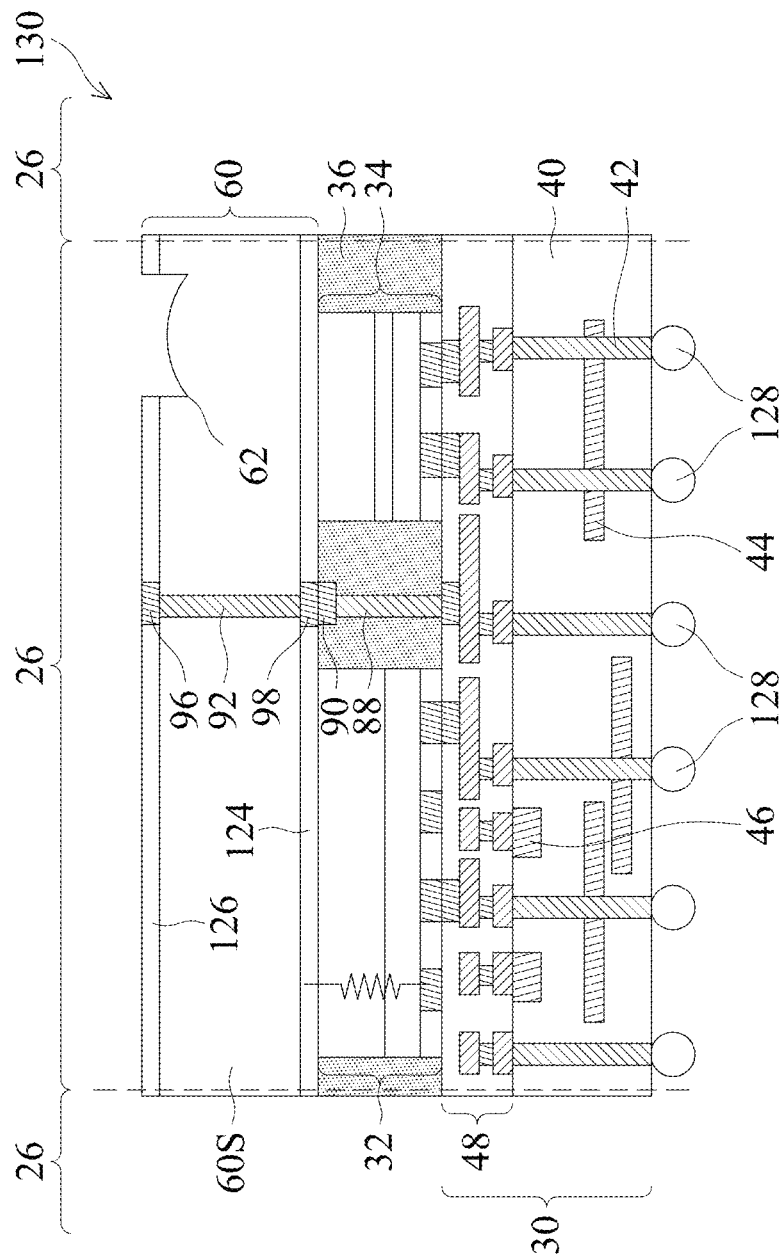

Referring to FIG. 11, the substrate 40 in photonic die 30 is thinned, so that through-vias 42 are revealed from bottom. In a subsequent process, as shown in FIG. 12, solder regions 128 are formed and electrically connected to through-vias 42. There may also be (or may not be) a backside interconnect structure (not shown) formed, which may include dielectric layers and RDLs. The backside interconnect structure will be formed between (and electrically interconnect) solder regions 128 and through-vias 42 in accordance with some embodiments. Reconstructed wafer 130 is thus formed. Next, reconstructed wafer 130 is singulated to form a plurality of discrete photonic engines 26, which are identical to each other.

Figure 13:
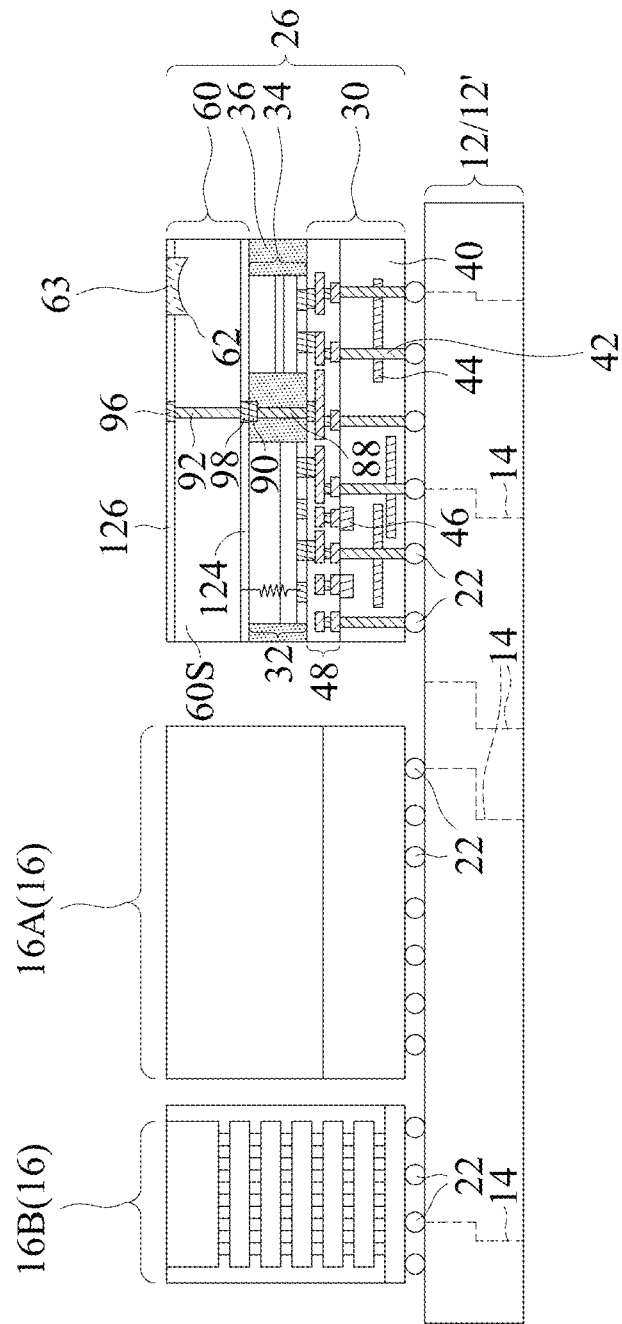
Figure 14:
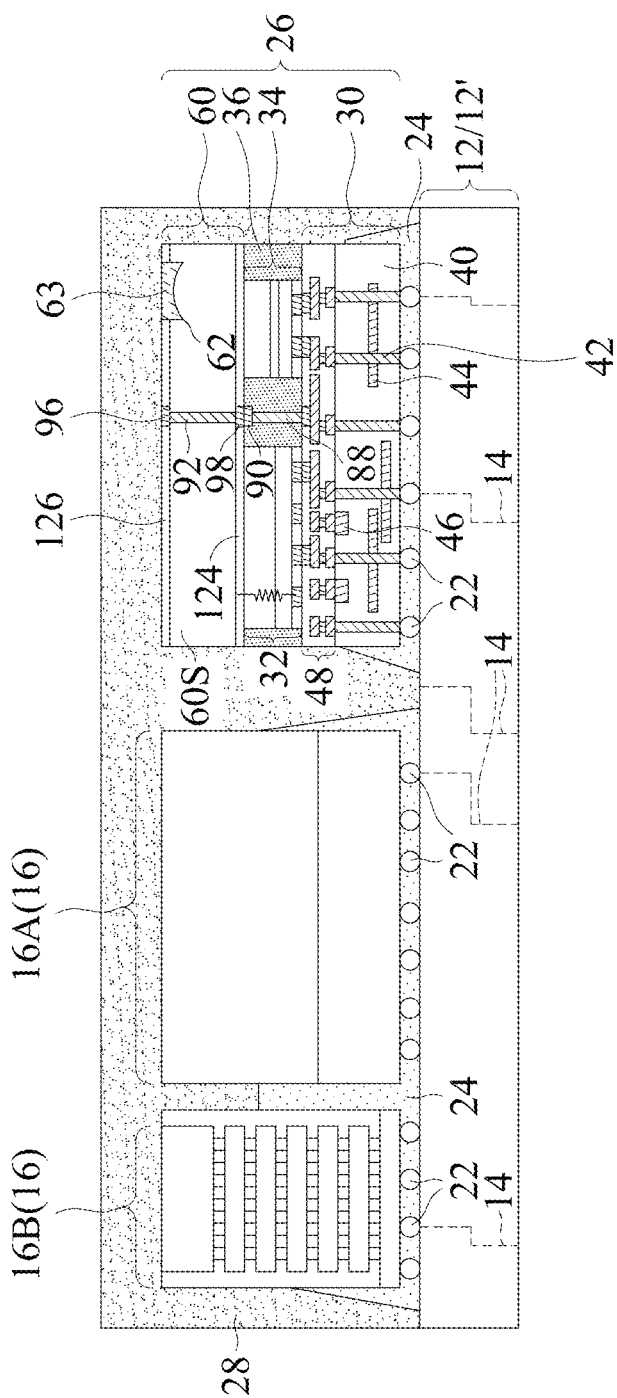

Referring to FIG. 13, package components 16 and photonic engine 26 are bonded to interposer wafer 12, for example, through solder regions 22. Next, as shown in FIG. 14, underfill 24 is dispensed into the gaps between package components 16 and photonic engine 26 and their respective underlying portions of interposer wafer 12. Encapsulant 28 is then dispensed and cured, and may include a molding compound in accordance with some embodiments.

Figure 15:
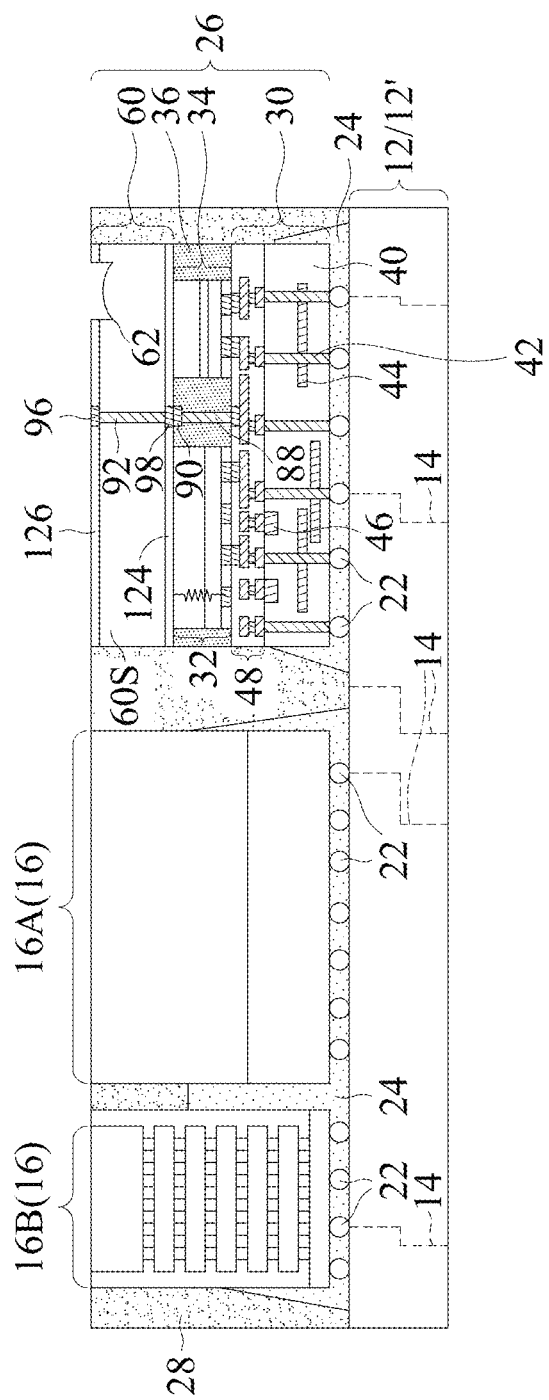

As shown in FIG. 15, encapsulant 28 is planarized to reveal the top surfaces of package components 16 and supporting substrate 60. Bond pads 96 are also revealed. The recess of micro lens 62 are also cleared, for example, by removing the materials (such as protection layer 63 or encapsulant 28) filled therein.

Figure 16:
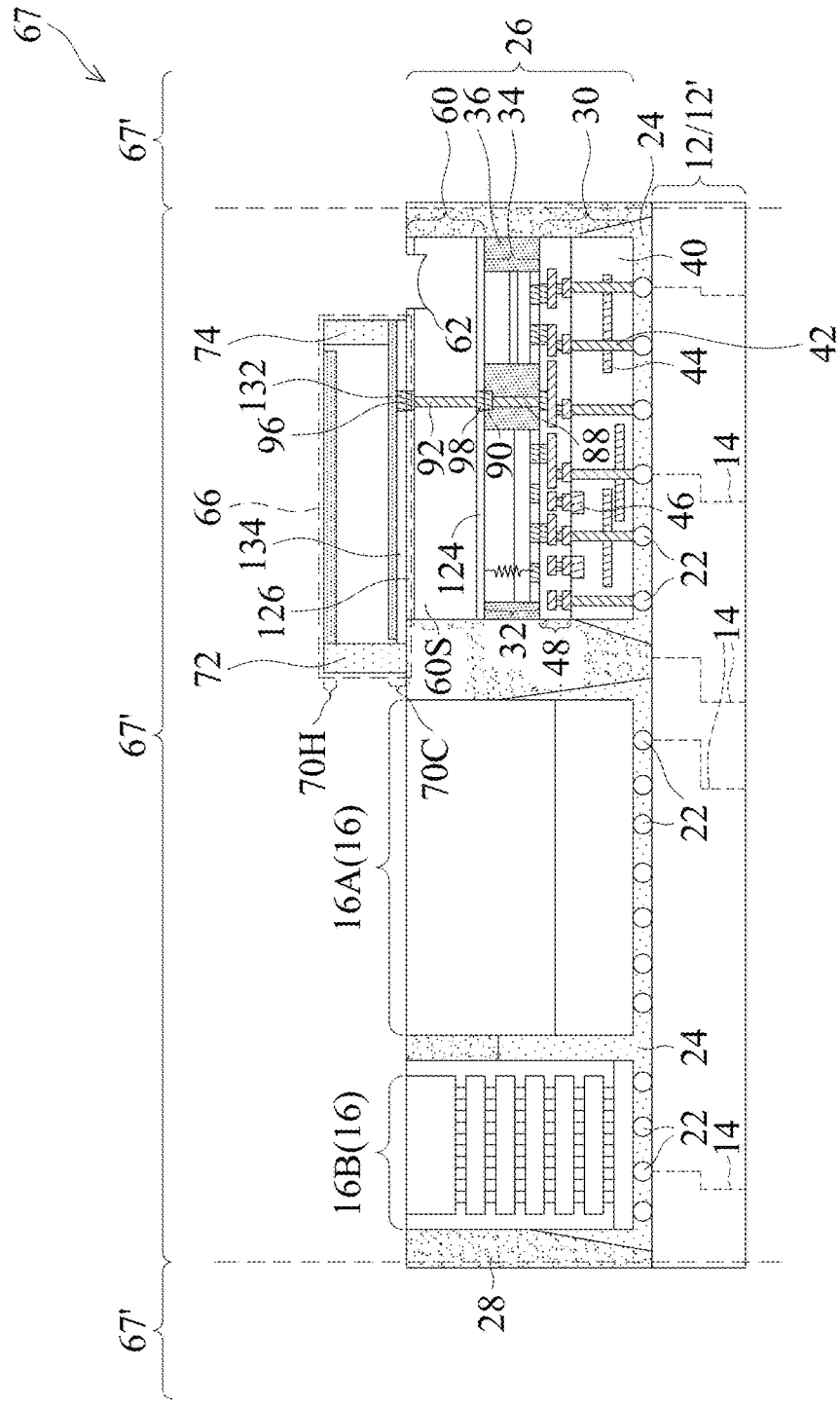

Next, as shown in FIG. 16, TEC 66 is bonded to supporting substrate 60, for example through hybrid bonding. In accordance with some embodiments, TEC 66 includes dielectric layer 134 and bond pads 132 in dielectric layer 134, with the bottom surfaces of dielectric layer 134 and bond pads 132 being coplanar. Bond pads 132 may be electrically connected to current input node 72 and current output node 74 through the interconnects (such as metal pads 114 as shown in FIGS. 28A and 28B, or the metal pads in FIGS. 29 and 30) inside TEC 66.

In accordance with some embodiments, two bond pads 132 are bonded to the respective bond pads 96, with one of bond pads 132 electrically connected to current input node 72 (FIG. 16), and the other electrically connected to current output node 74. In accordance with other embodiments, a single bond pad 132 is formed, and bonded to the respective bond pad 96. The single bond pad 132 may be connected to either current input node 72 or current output node 74. The other one of current input node 72 or current output node 74 may be electrically connected to interposer 12' or package component 76 (FIG. 18) through a through-via 136 (FIG. 25), or through a bond wire 78 (FIG. 6). Reconstructed wafer 67 is thus formed. Reconstructed wafer 67 is then singulated into discrete packages 67'.

Figure 17:
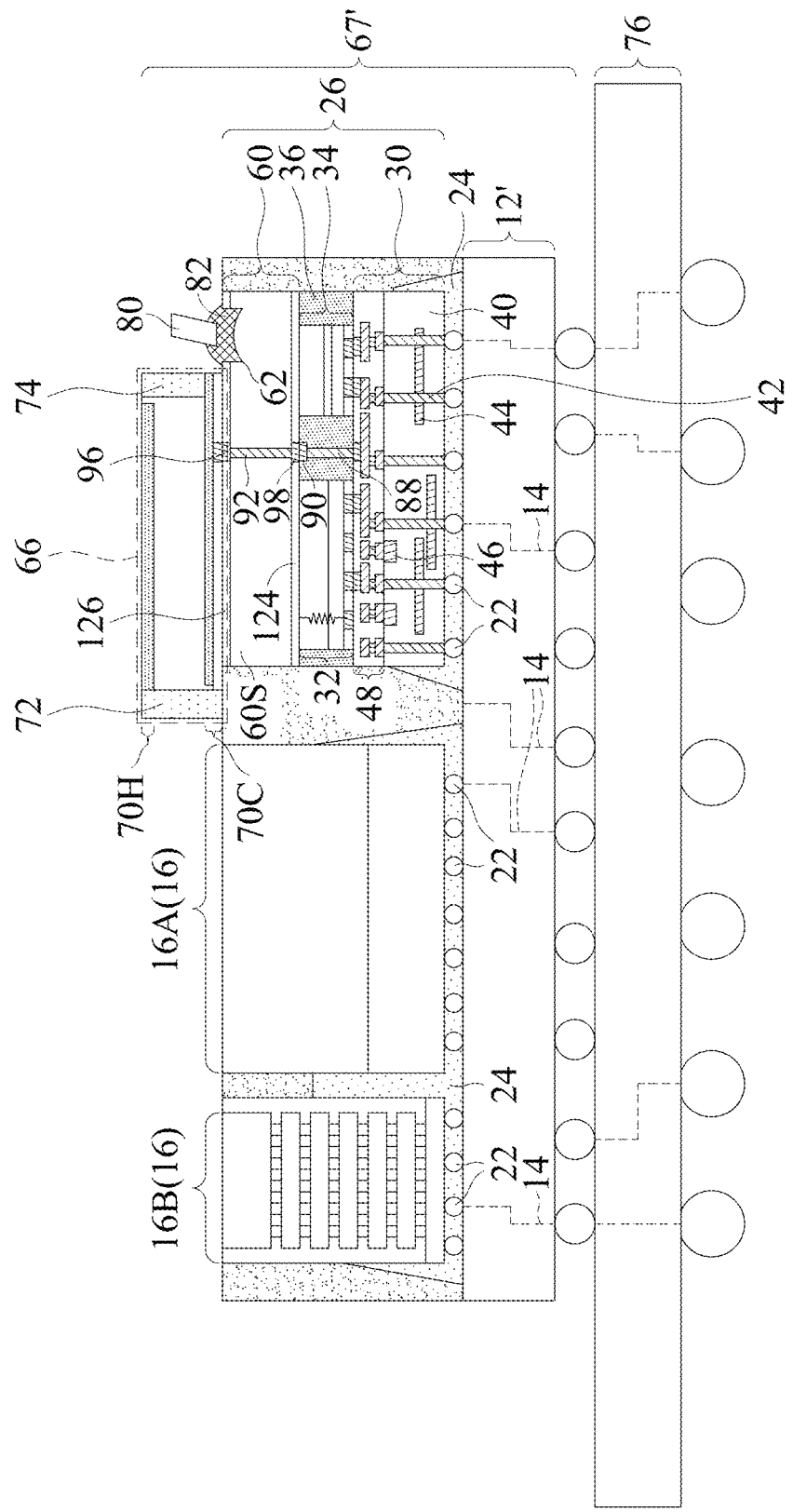

Referring to FIG. 17, package 67' is bonded to package component 76, which may be a package substrate, a printed circuit board, another package, or the like. Optical fiber 80 is also attached to supporting substrate 60 through optical glue 82, and is aligned to micro lens 62.

Figure 18:
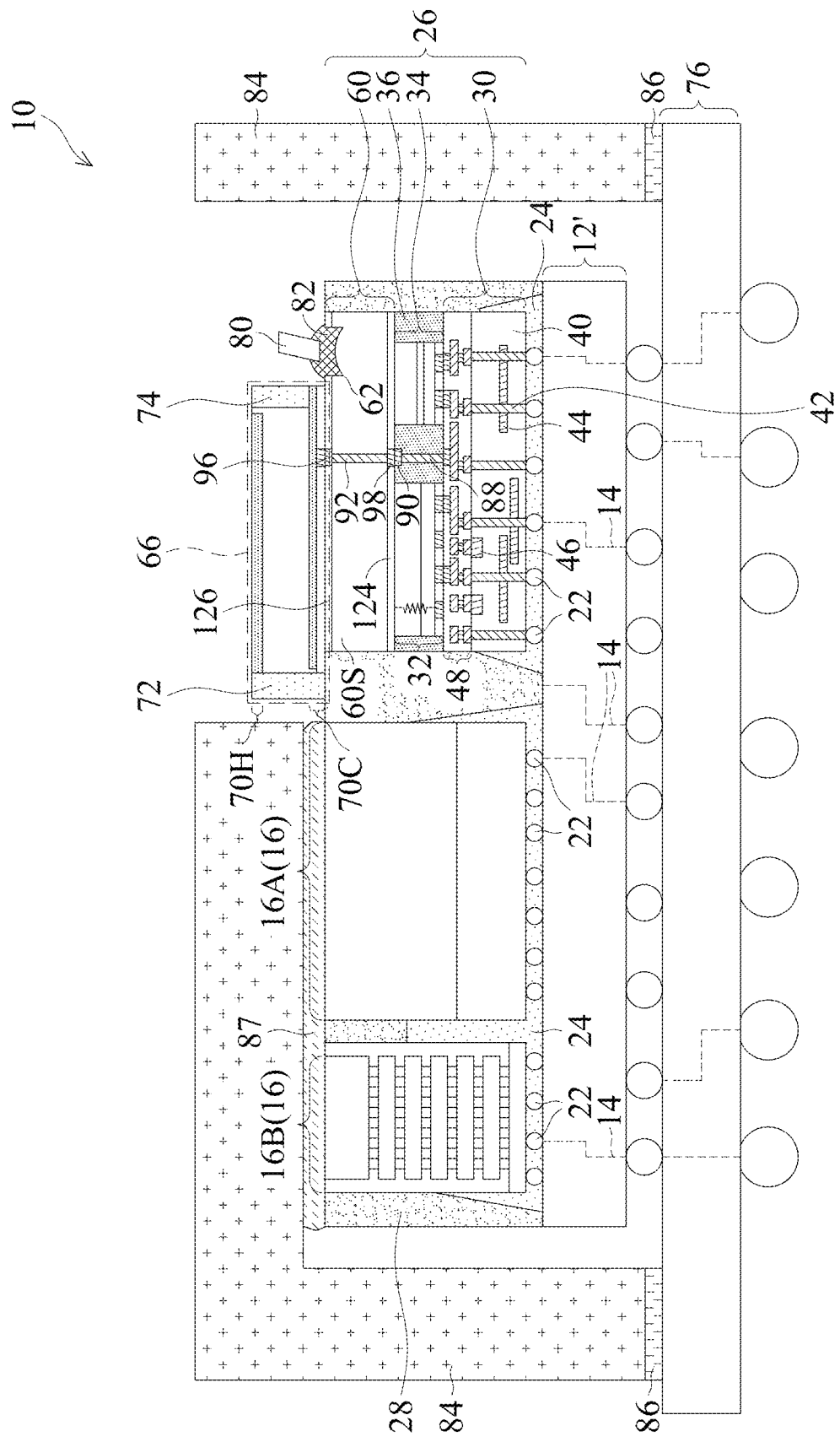

FIG. 18 illustrates the attachment of metal lid 84 to package component 76 through adhesive 86. Also, metal lid 84 is attached to the top surfaces of package components 16 through TIM 87, so that the heat generated in package components 16 may be dissipated into metal lid 84. Package 10 is thus formed.

FIGS. 19 through 25 illustrate the cross-sectional views of intermediate stages in the formation of a package in accordance with some embodiments of the present disclosure. These embodiments are similar to the embodiments shown in FIGS. 1 through 6, except that instead of forming wire bonds, through-vias are formed to penetrate through encapsulant 28 in order to provide the current used by TEC 66.

Figure 19:
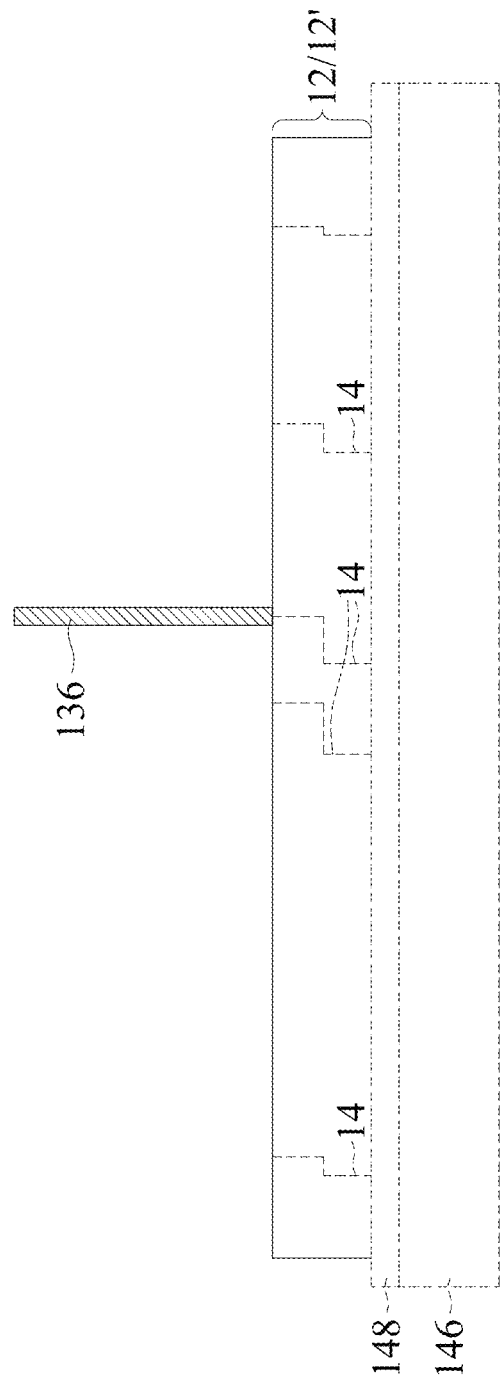
FIG. 19 through 25 illustrate the cross-sectional views of the intermediate stages in the formation of a package including a TEC for dissipating heat from a photonic engine, wherein through-molding vias are used for conducting current in accordance with some embodiments.

Referring to FIG. 19, interposer wafer 12 is provided. Metal posts 136 are formed on interposer wafer 12, and are electrical connected to electrical connections 14. Although one metal post 136 is formed, there may be two metal posts 136 formed over each of interposers 12' in interposer wafer 12. In accordance with some embodiments, at the time metal posts 136 are formed, interposer wafer 12 has the structure shown in FIG. 26, wherein interposer wafer 12 includes silicon substrate 140, and conductive posts 138 extending into (but not penetrating through) silicon substrate 140. Interconnect structure 142 is formed over substrate 140, and includes dielectric layers and redistribution lines (metal lines and vias). The redistribution lines are electrically connected to metal posts 138.

In accordance with alternative embodiments, at the time metal posts 136 are formed, interposer wafer 12 has the structure shown in FIG. 31. In the structure shown in FIG. 31, a backside grinding process has already been performed on the backside of substrate 140, and metal posts 138 are revealed to form through-vias (also referred to as through-vias 138). Solder regions 144 may or may not be formed at this time. In accordance with these embodiments, since interposer wafer 12 is thin, a carrier 146 (FIG. 19) may be placed underlying the interposer wafer 12 to provide mechanical support. Release film 148, which may be a Light-to-Heat Conversion (LTHC) layer, may adhere interposer wafer 12 to carrier 146. Carrier 146 and release film 148 are shown as being dashed to indicate that they may or may not be adopted when metal posts 136 are formed.

Referring again to FIG. 19, the formation of through-vias 136 may include depositing a metal seed layer (not shown) on interposer wafer 12, forming a patterned plating mask (not shown) such as a patterned photoresist, and plating metal posts 136 in the openings in the plating mask. The plating mask is then removed, followed by an etching process to remove the portions of the metal seed layer previously covered by the plating mask.

Figure 20:
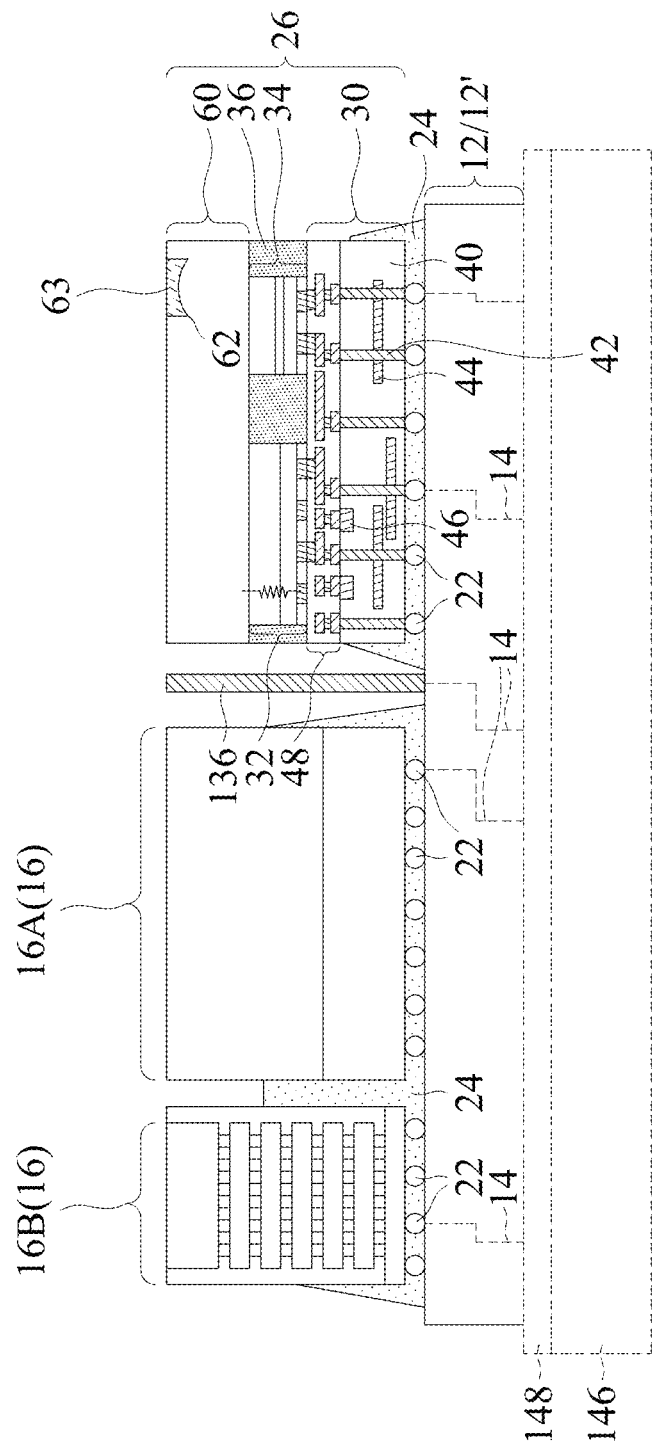
Figure 21:
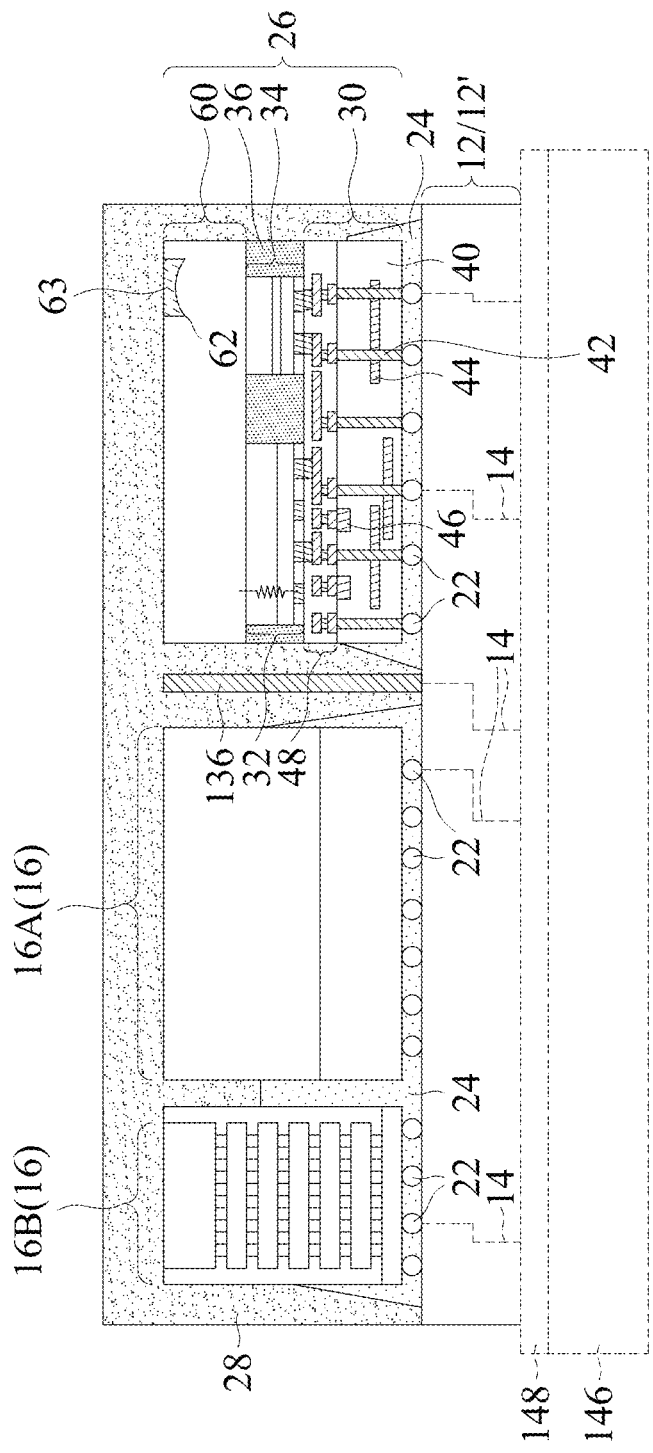

Referring to FIG. 20, package components 16 and photonic engine 26 are bonded to interposer wafer 12. Underfill 24 is dispensed into the gaps between package components 16 and photonic engine 26 and their respective underlying portions of interposer wafer 12. Next, as shown in FIG. 21, encapsulant 28 is dispensed to mold package components 16 and photonic engine 26, and metal posts 136 therein. Encapsulant 28 may include a molding compound, a molding underfill, a resin, an epoxy, or the like in accordance with some embodiments.

Figure 22:
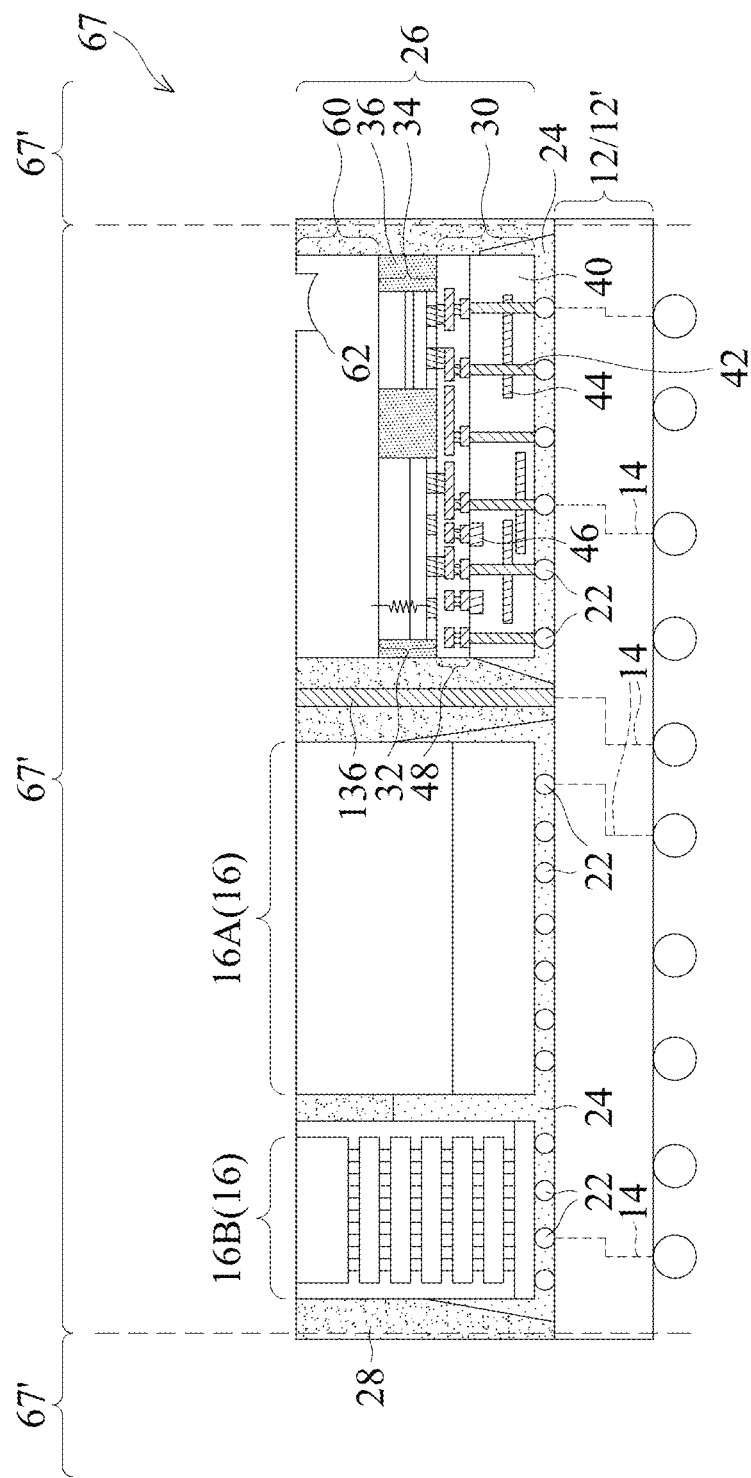

As shown in FIG. 22, encapsulant 28 is planarized to reveal the top surfaces of package components 16 and supporting substrate 60. Metal posts 136 are also revealed. Since metal posts 136 now penetrate through encapsulant 28, metal posts 136 are referred to as through-vias or through-dielectric vias throughout the description. The recess of micro lens 62 are also cleared, for example, by removing the materials (such as a protection layer 63 or encapsulant 28) filled therein.

As aforementioned, if metal posts 136 are formed on the interposer wafer 12 as shown in FIG. 19, carrier 146 and release film 148 may be underlying interposer wafer 12. Carrier 146 may thus be de-bonded, for example, by projecting a laser beam on release film 148, thus decomposing release film 148. Otherwise, if interposer wafer 12 has the structure shown in FIG. 26, the processes as shown in FIGS.

26 and 27 (as will be discussed in subsequent paragraphs) will be performed to finish the formation of interposer wafer 12 and electrical connections 14. Reconstructed wafer 67 is thus formed. A singulation process may be performed to saw reconstructed wafer 67 into discrete packages 67', as also shown in FIG. 22.

Figure 23:
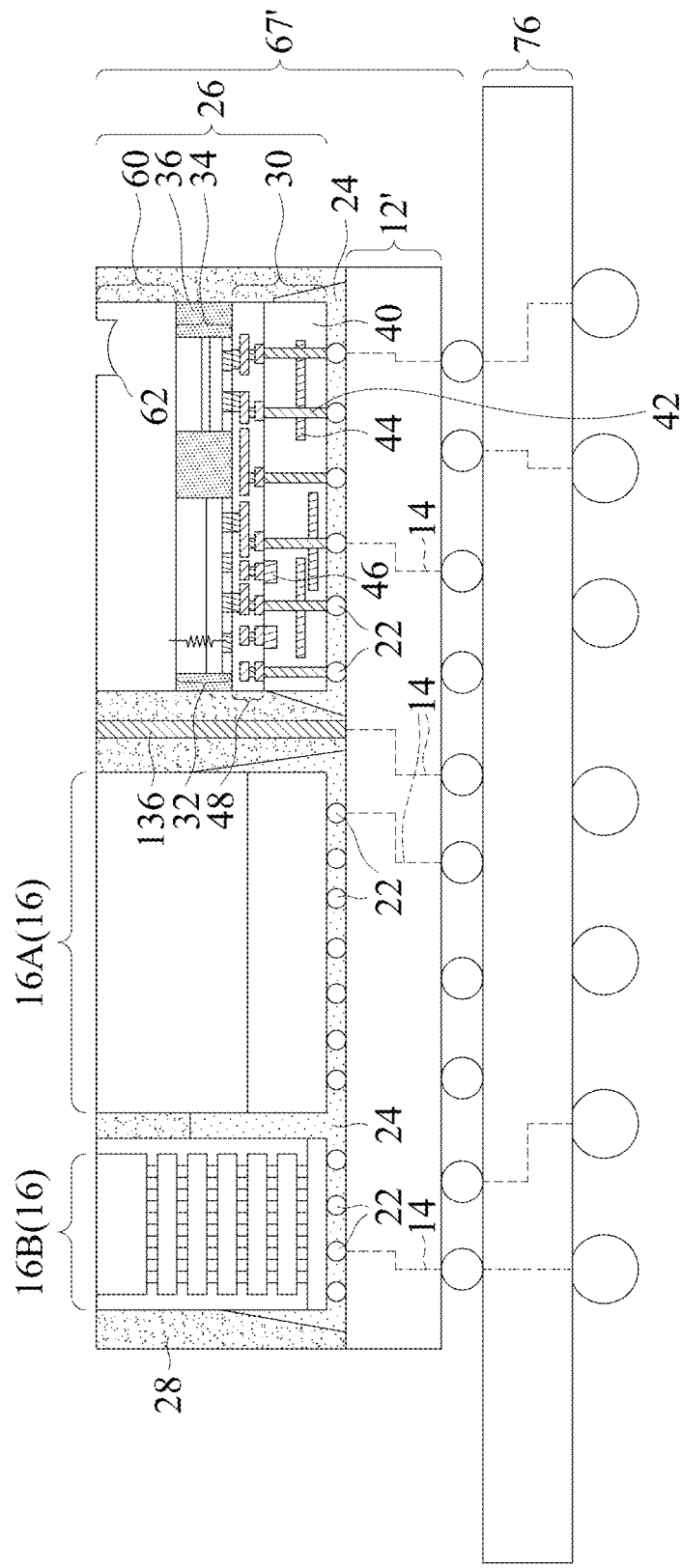

Referring to FIG. 23, package 67' is bonded to package component 76, which may be a package substrate, a printed circuit board, another package, or the like. Optical fiber 80 is also attached to supporting substrate 60, and aligned to micro lens 62 through optical glue 82, as shown in FIG. 24.

Figure 24:
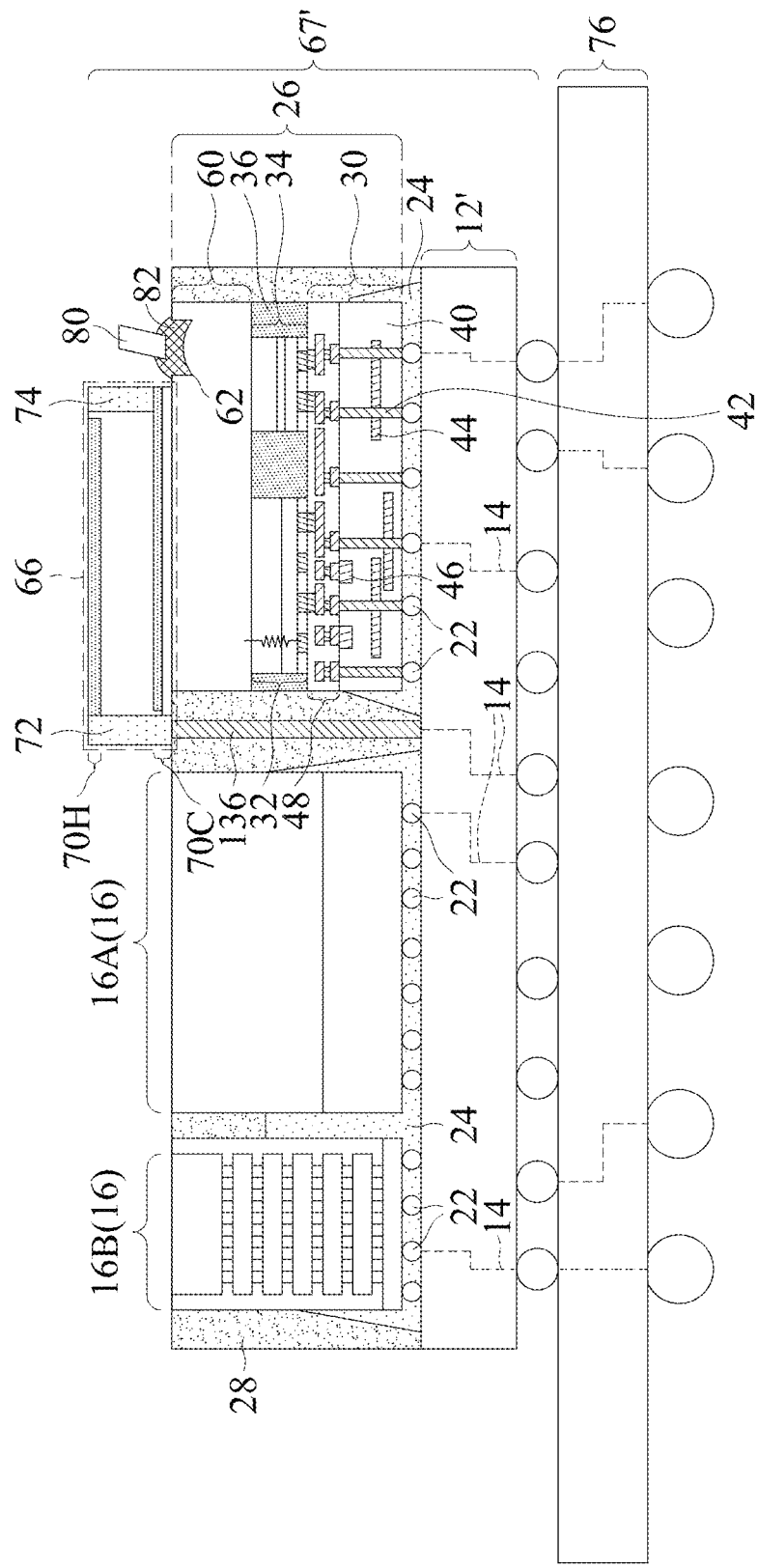

As also shown in FIG. 24, TEC 66 is bonded to supporting substrate 60, for example, through hybrid bonding. The bond pads in TEC 66, which may be current input node 72 and/or current output node 74 (or additional bond pads electrically connected to current input node 72 and/or current output node 74) are bonded to through-vias 136. The current input node 72 and/or current output node 74 are thus electrically connected to through-vias 136. In order to bond through-vias 136 to TEC 66, TEC 66 laterally extends beyond the edges of photonic engine 26, with a portion overlapping encapsulant 28.

The bonding of TEC 66 to through-vias 136 may be through the bond pads formed at the bottom of TEC 66. Alternatively, the current input node 72 and current output node 74 may be directly bonded to through-vias 136 when current input node 72 and current output node 74 extends to the bottom of TEC 66. In accordance with some embodiments, through-vias 136 are bonded to the metal features in TEC 66 through metal-to-metal direct bonding. In accordance with alternative embodiments, the bonding may be performed through hybrid bonding, which includes bonding through-vias 136 to the metal features in TEC 66 through metal-to-metal direct bonding, and bonding supporting substrate 60 to a surface dielectric layer at the bottom of TEC 66. Optical fiber 80 is also attached to supporting substrate 60, for example, through optical glue 82.

In accordance with alternative embodiments, the sequence of the bonding of TEC 66 and package component 76 may be inversed.

In accordance with some embodiments, two through-vias 136 are formed and bonded to TEC 66, with one of through-vias 136 electrically connected to current input node 72, and the other electrically connected to current output node 74. In accordance with other embodiments, a single through-via 136 is formed, and bonded to the respective metal feature in TEC 66. The single through-via 136 may be connected to either current input node 72 or current output node 74. The other one of current input node 72 or current output node 74 may be electrically connected to interposer 12' or package component 76 (FIG. 24) through a through-via 92 (FIG. 18), or through a bond wire 78 (FIG. 6).

Figure 25:
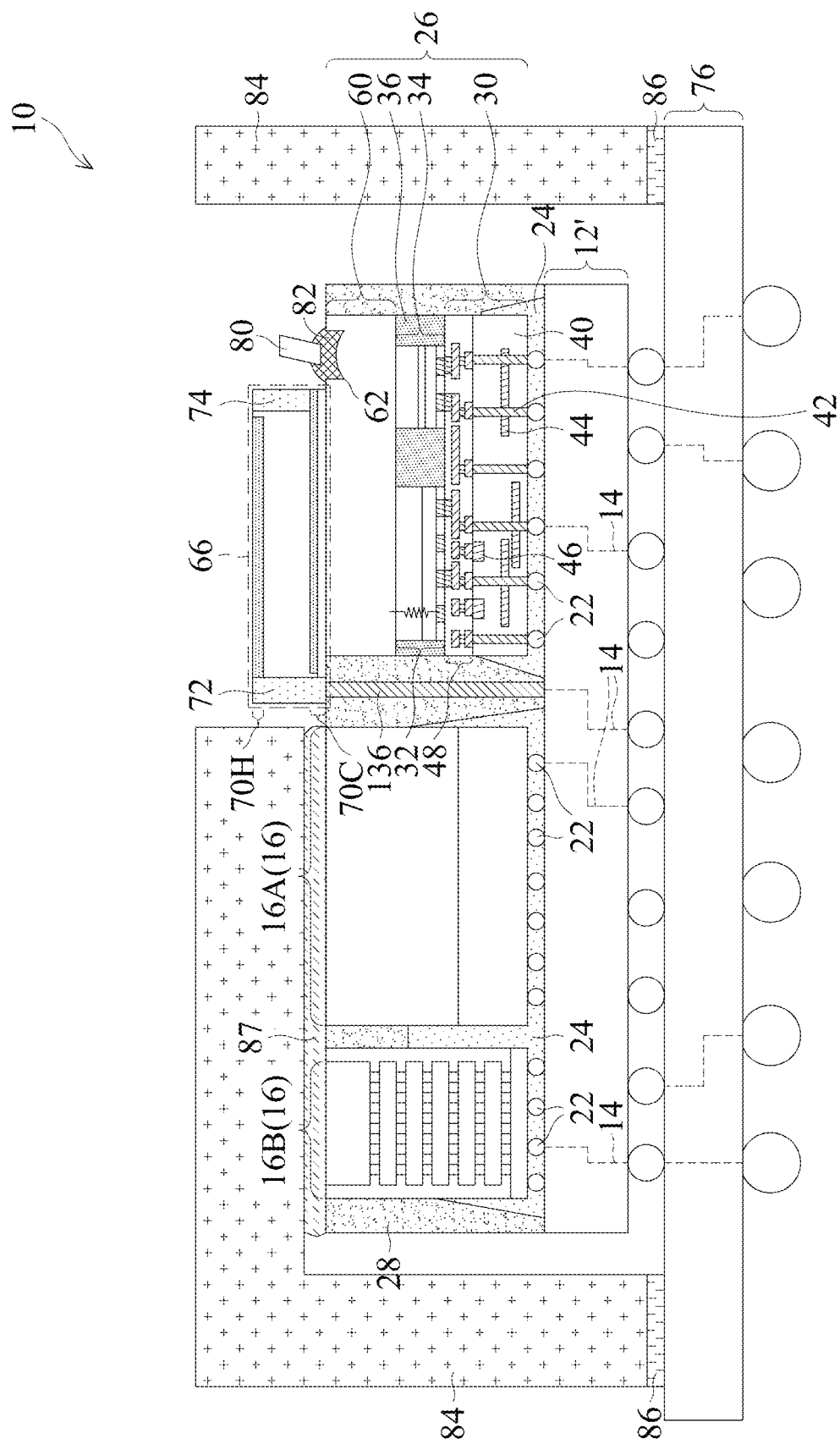

FIG. 25 illustrates the attachment of metal lid 84 to package component 76 through adhesive 86. Also, metal lid 84 is attached to the top surfaces of package components 16 through TIM 87, so that the heat generated in package components 16 may be dissipated into metal lid 84. Package 10 is thus formed.

Figure 26:
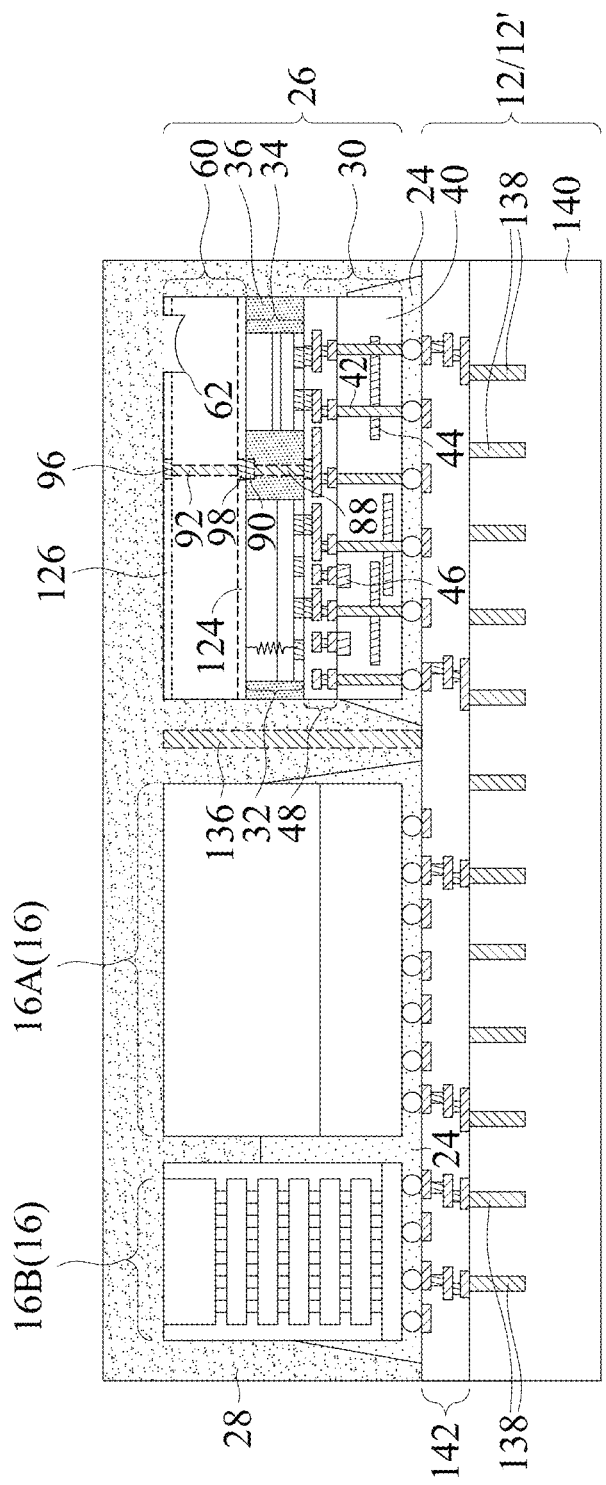
FIGS. 26-27 illustrate cross-sectional views of intermediate stages in the bonding and thinning of a silicon-base interposer in accordance with some embodiments.
Figure 27:
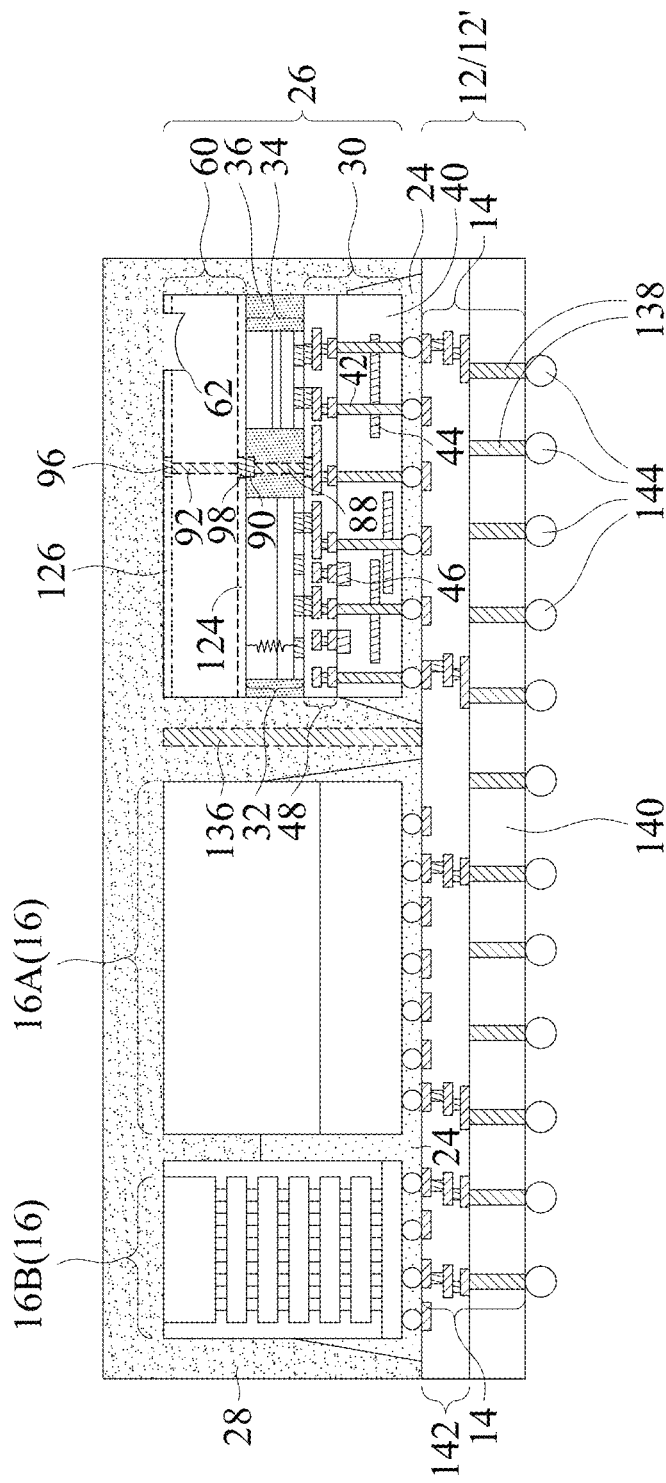

FIGS. 26 and 27 illustrate an embodiment in which the formation of interposer wafer 12 is completed after package components 16 and photonic engine 26 are bonded to interposer wafer 12. FIG. 26 illustrates a structure that may appear in the process as shown in FIG. 1, FIG. 14, or FIG. 21. As shown in FIG. 26, interposer wafer 12 includes semiconductor substrate 140, which may be a silicon substrate. Metal posts 138 in interposer wafer 12 extend to an intermediate level between a top surface and a bottom surface of silicon substrate 140. In FIG. 26, the through-vias 136 in encapsulant 28, the through-vias 88 in gap-filling region 36, and the through-vias 92 in supporting substrate 60 are illustrated using dashed lines to indicate that these through-vias may be or may not be formed in accordance with different embodiments as shown in FIGS. 1, 14, and 21.

FIG. 27 illustrates the thinning of substrate 140, so that through-vias 138 are revealed through the bottom surface of substrate 140. Next, solder region 144 are formed to complete the formation of interposer wafer 12. In accordance with some embodiments, a backside interconnect structure (including RDLs, not shown) may be formed between, and electrically interconnecting, solder regions 144 and through-vias 138.

FIGS. 31 and 32 illustrate some example structures of interposer 12' and interposer wafer 12 in accordance with some embodiments. FIG. 31 illustrates a silicon-based interposer 12', which includes silicon substrate 140 and through-vias 138 penetrating through the silicon substrate 140, as also shown in FIGS. 26 and 27. FIG. 32 illustrates an LSI interposer including LSI dies 150. Front-side RDLs 152A and backside RDLs 152B are formed on the front side and the backside of LSI dies 150, respectively. LSI dies 150 may be encapsulated in encapsulant 156. Through-via(s) 154 may be formed to penetrate through encapsulant 156, and may interconnect Front-side RDLs 152A and backside RDLs 152B. Two package components (such as package components 16A and 16B and photonic engine 26) may be interconnected through the metal lines built inside LSI dies 150, and through RDLs 152A.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By adopting TEC for cooling photonic engines, the efficiency of cooling photonic engines, which has a high heat-generating ability, is improved. On the other hand, logic dies and memory dies, which generates less heat than the photonic engines, may be cooled using metal lids, so that the need of cooling and the reduction of power consumption used for cooling may be optimized.

In accordance with some embodiments of the present disclosure, a method comprises bonding a photonic engine onto an interposer; bonding a package component onto the interposer, wherein the package component comprises a device die; encapsulating the package component and the photonic engine in an encapsulant; attaching a thermal-electronic cooler to the photonic engine; and attaching a metal lid to the package component. In an embodiment, the method further comprises performing a wire bonding process to connect a metal wire to the thermal-electronic cooler. In an embodiment, the method further comprises forming a through-via, wherein the encapsulant further encapsulates the through-via therein, and wherein the thermal-electronic cooler is electrically connected to the through-via.

In an embodiment, the photonic engine comprises a supporting substrate comprising a through-via therein, wherein the thermal-electronic cooler is electrically connected to the through-via. In an embodiment, the method further comprises forming the photonic engine comprising bonding an electronic die and a photonic component to a photonic die; and attaching the supporting substrate to the electronic die and the photonic component, wherein the supporting substrate comprises a micro lens therein. In an embodiment, the method further comprises attaching an optical fiber to the micro lens. In an embodiment, the method further comprises conducting a current through the thermal-electronic cooler, wherein the thermal-electronic cooler has a cold side and a hot side in response to the current, wherein the cold side is attached to the photonic engine, and wherein the hot side is farther away from the photonic engine than the cold side.

In an embodiment, the interposer comprises a silicon substrate; and through-vias penetrating through the silicon substrate. In an embodiment, the interposer comprises a local silicon interconnect die; and redistribution lines connected through the Local Silicon Interconnect die. In an embodiment, the attaching the thermal-electronic cooler comprises attaching a BiTe-based thermal-electronic cooler.

In accordance with some embodiments of the present disclosure, a package comprises a photonic engine; a package component comprising a device die; an encapsulant encapsulating the package component and the photonic engine therein; a thermal-electronic cooler attached to the photonic engine, wherein the thermal-electronic cooler comprises a current input node and a current output node, and wherein the thermal-electronic cooler comprises a cold side and a hot side, with the cold side being between the hot side and the photonic engine; a thermal interface material; and a metal lid attached to the package component through the thermal interface material. In an embodiment, the package further comprises a bond wire attached to one of the current input node and the current output node.

In an embodiment, the package further comprises a through-via penetrating through the encapsulant, wherein the thermal-electronic cooler is electrically connected to the through-via. In an embodiment, the photonic engine comprises a supporting substrate, wherein the supporting substrate comprises a through-via therein, and wherein the thermal-electronic cooler is electrically connected to the through-via. In an embodiment, the photonic engine comprises a photonic die; an electronic die and a photonic component over and bonding to the photonic die; and a supporting substrate over and attached to the electronic die and the photonic component. In an embodiment, the supporting substrate comprises a micro lens therein, and wherein the package further comprises an optical fiber attached to the micro lens.

In accordance with some embodiments of the present disclosure, a package comprises a package substrate; an interposer over and bonded to the package substrate; a first package component over and bonded to the interposer, the first package component comprising a photonic die; an optical fiber configured to signally couple to the photonic die; a thermal-electronic cooler attached to the first package component, wherein the thermal-electronic cooler is configured to dissipate heat in the first package component; a second package component over and bonded to the interposer; and a metal lid attached to the second package component, wherein the metal lid is configured to dissipate heat in the second package component.

In an embodiment, the thermal-electronic cooler is configured to have a cold side and a hot side being generated when supplied with a current, and wherein the cold side is attached to the first package component. In an embodiment, the first package component further comprises a supporting substrate over the photonic die, wherein the supporting substrate comprises a micro lens therein. In an embodiment, the package further comprises a laser diode bonded to the photonic die, wherein the supporting substrate is attached to the laser diode, and wherein the optical fiber is optically coupled to the laser diode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a photonic engine onto an interposer;
    forming a first through-via over the interposer;
    bonding a package component onto the interposer, wherein the package component comprises a device die;
    encapsulating the package component, the first through-via, and the photonic engine in an encapsulant;
    attaching a thermal-electronic cooler to the photonic engine, wherein the thermal-electronic cooler is electrically connected to the first through-via; and
    attaching a metal lid to the package component.

2. The method of claim 1 further comprising performing a wire bonding process to connect a metal wire to the thermal-electronic cooler.

3. The method of claim 1, wherein the thermal-electronic cooler overlaps the photonic engine, and is vertically offset from the device die.

4. The method of claim 1, wherein the photonic engine comprises:
    a supporting substrate comprising a second through-via therein, wherein the thermal-electronic cooler is electrically connected to the second through-via.

5. The method of claim 4 further comprising forming the photonic engine comprising:
    bonding an electronic die and a photonic component to a photonic die; and
    attaching the supporting substrate to the electronic die and the photonic component, wherein the supporting substrate comprises a micro lens therein.

6. The method of claim 5 further comprising attaching an optical fiber to the micro lens.

7. The method of claim 1 further comprising conducting a current through the thermal-electronic cooler, wherein the thermal-electronic cooler has a cold side and a hot side in response to the current, wherein the cold side is attached to the photonic engine, and wherein the hot side is farther away from the photonic engine than the cold side.

8. The method of claim 1, wherein the interposer comprises:
    a silicon substrate; and
    through-vias penetrating through the silicon substrate.

9. The method of claim 1, wherein the interposer comprises:
a local silicon interconnect die; and
redistribution lines connected through the local silicon interconnect die.

10. The method of claim 1, wherein the attaching the thermal-electronic cooler comprises attaching a BiTe-based thermal-electronic cooler.

11. A package comprising:
a photonic engine;
a package component comprising a device die;
an encapsulant encapsulating the package component and the photonic engine therein;
a thermal-electronic cooler attached to the photonic engine, wherein the thermal-electronic cooler comprises a current input node and a current output node, and wherein the thermal-electronic cooler comprises a cold side and a hot side, with the cold side being between the hot side and the photonic engine;
a thermal interface material; and
a metal lid attached to the package component through the thermal interface material.

12. The package of claim 11, wherein the package further comprises a bond wire attached to one of the current input node and the current output node.

13. The package of claim 11 further comprising:
a through-via penetrating through the encapsulant, wherein the thermal-electronic cooler is electrically connected to the through-via.

14. The package of claim 11, wherein the photonic engine comprises a supporting substrate, wherein the supporting substrate comprises a through-via therein, and wherein the thermal-electronic cooler is electrically connected to the through-via.

15. The package of claim 11, wherein the photonic engine comprises:
a photonic die;
an electronic die and a photonic component over and bonding to the photonic die; and
a supporting substrate over and attached to the electronic die and the photonic component.

16. The package of claim 15, wherein the supporting substrate comprises a micro lens therein, and wherein the package further comprises an optical fiber attached to the micro lens.

17. A package comprising:
a package substrate;
an interposer over and bonded to the package substrate;
a first package component over and bonded to the interposer, the first package component comprising:
a photonic die; and
a supporting substrate over the photonic die, wherein the supporting substrate comprises a micro lens therein;
an optical fiber configured to signally couple to the photonic die;
a thermal-electronic cooler attached to the first package component, wherein the thermal-electronic cooler is configured to dissipate heat in the first package component;
a second package component over and bonded to the interposer; and
a metal lid attached to the second package component, wherein the metal lid is configured to dissipate heat in the second package component.

18. The package of claim 17, wherein the thermal-electronic cooler is configured to have a cold side and a hot side being generated when supplied with a current, and wherein the cold side is attached to the first package component.

19. The package of claim 17 further comprising a through-via in the supporting substrate, wherein the through-via is configured to conduct a current to the thermal-electronic cooler.

20. The package of claim 17 further comprising:
a laser diode bonded to the photonic die, wherein the supporting substrate is attached to the laser diode, and wherein the optical fiber is optically coupled to the laser diode.

* * * * *